(12) United States Patent
Hughes

(10) Patent No.: US 7,605,659 B2
(45) Date of Patent: Oct. 20, 2009

(54) GAIN ADJUSTMENT FOR PROGRAMMABLE GAIN AMPLIFIERS

(75) Inventor: Rodney Alan Hughes, Tacoma, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 382 days.

(21) Appl. No.: 11/753,416

(22) Filed: May 24, 2007

(65) Prior Publication Data

US 2008/0252378 A1    Oct. 16, 2008

Related U.S. Application Data

(60) Provisional application No. 60/843,308, filed on Sep. 7, 2006.

(51) Int. Cl.
*H03G 3/00* (2006.01)

(52) U.S. Cl. .................. 330/282; 330/254; 330/86

(58) Field of Classification Search .............. 330/282, 330/254, 86
See application file for complete search history.

(56) References Cited

U.S. PATENT DOCUMENTS

| | | | | |
|---|---|---|---|---|
| 3,795,825 | A | 3/1974 | McGhee | 307/264 |
| 4,396,890 | A | 8/1983 | Kato et al. | 330/86 |
| 4,574,249 | A * | 3/1986 | Williams | 330/59 |
| 5,189,421 | A | 2/1993 | Daugherty | 341/157 |
| 5,233,309 | A | 8/1993 | Spitalny et al. | 330/86 |
| 5,325,073 | A * | 6/1994 | Hasegawa | 330/290 |
| 5,387,879 | A | 2/1995 | Satoh | 330/86 |
| 5,481,225 | A | 1/1996 | Lumsden et al. | 330/254 |
| 5,512,859 | A | 4/1996 | Moraveji | 330/267 |
| 5,955,925 | A | 9/1999 | Segawa et al. | 330/279 |
| 6,020,785 | A | 2/2000 | Allen et al. | 330/2 |
| 6,031,421 | A | 2/2000 | McEwan | 330/10 |

(Continued)

FOREIGN PATENT DOCUMENTS

DE    196 30 393 A1    1/1998

(Continued)

OTHER PUBLICATIONS

Wooley, "Cascaded Noise-Shaping Modulators for Oversampled Data Conversion," Custom Integrated Circuits Conference, Proceedings of IEEE 2003, Sep. 21-24, 2003, pp. 113-114.

(Continued)

*Primary Examiner*—Patricia Nguyen
(74) *Attorney, Agent, or Firm*—Merchant & Gould, P.C.

(57) ABSTRACT

A programmable gain amplifier (PGA) circuit includes a gain adjust circuit and a gain select circuit that are both coupled to an output of an amplifier. The gain select circuit completes feedback to the amplifier while the gain adjust circuit is arranged to boost or cut the gain of the gain selection circuit. The gain adjust circuit can be arranged as a trim adjustment to the overall gain of the PGA circuit, where a different trim adjustment can be mapped to each gain setting such as from a look-up table. In other example implementations, the PGA circuit can periodically switch between multiple gain settings using a modulation scheme such that the overall gain is blended between the various gain settings according to a duty cycle, pulse-width, or delta-sigma modulation, with a time averaging effect on the overall gain of the PGA circuit.

20 Claims, 15 Drawing Sheets

U.S. PATENT DOCUMENTS

| | | | |
|---|---|---|---|
| 6,046,632 A * | 4/2000 | Straw .............................. | 330/2 |
| 6,198,349 B1 | 3/2001 | Kanno et al. ................ | 330/282 |
| 6,294,958 B1 | 9/2001 | Eschauzier ................. | 330/267 |
| 6,396,934 B1 | 5/2002 | Federspiel ................. | 381/100 |
| 7,102,440 B2 | 9/2006 | Damitio et al. ............ | 330/267 |
| 7,352,242 B1 | 4/2008 | Hughes ...................... | 330/254 |
| 7,554,243 B2 * | 6/2009 | Ollila ......................... | 310/317 |
| 2005/0024129 A1 | 2/2005 | Jang ........................... | 327/541 |
| 2005/0225393 A1 | 10/2005 | Lee et al. ................... | 330/284 |
| 2005/0285674 A1 | 12/2005 | Zaguri ........................ | 330/254 |
| 2006/0093153 A1 | 5/2006 | Yamamoto et al. ........... | 381/59 |
| 2006/0181343 A1 | 8/2006 | Moon et al. .................. | 330/86 |

FOREIGN PATENT DOCUMENTS

| | | |
|---|---|---|
| EP | 0 091 160 A | 10/1983 |
| EP | 0 495 302 A | 7/1992 |
| EP | 0 571 075 A2 | 11/1993 |
| EP | 0 571 075 A3 | 11/1993 |
| EP | 1 0001 527 A | 5/2000 |
| JP | 57 125507 A | 8/1982 |
| JP | 58 124310 A | 7/1983 |
| JP | 63 132510 A | 6/1988 |
| WO | WO 99/63661 | 12/1999 |

OTHER PUBLICATIONS

Cheung et al., "An FPGA-based re-configurable 24-bit 96kHz sigma-delta audio DAC," Field-Programmable Technology, 2003 Proceedings. *2003 IEEE* International Conference on Dec. 15-17, 2003, pp. 110-117.

Tim Wescott, "Sigma-delta techniques extend DAC resolution" Jun. 23, 2004, *CMP Media LLC 2005,* http://www.embedded.com/showArticle.jhtml?articleID=22101730 (5 pgs).

* cited by examiner

US 7,605,659 B2

GAIN ADJUSTMENT FOR PROGRAMMABLE GAIN AMPLIFIERS

CROSS-REFERENCE TO RELATED APPLICATIONS

This utility patent application claims the benefit under 35 United States Code § 119(e) of U.S. Provisional Patent Application No. 60/843,308, filed on Sep. 7, 2006.

FIELD OF THE INVENTION

The present disclosure generally relates to electronic circuits. More particularly, the present disclosure relates to a technique for adjusting the gain associated with a programmable gain amplifier.

BACKGROUND

Many electronic systems employ programmable gain amplifiers as a basic analog building block. An example of a conventional programmable gain amplifier (800) is illustrated in FIG. 8. Programmable gain amplifier 800 includes an operational amplifier (AMP), three resistors (R81-R83), and two switches (S81-S82). The operational amplifier includes a non-inverting input terminal (INP), an inverting input terminal (INM), and an output terminal (AOUT). Switch S81 is connected between AOUT and node N81. Switch S82 is connected between AOUT and node N82. Resistor R81 is connected between node N81 and INM. Resistor R82 is connected between node N82 and INM. Resistor R83 is connected between INM and a circuit ground (GND).

In operation, operational amplifier AMP is configured to receive an input signal (e.g., IN) at the non-inverting input (INP), and provide an output signal (e.g. OUT) at the output terminal (AOUT) that is related to the input signal according to a gain scaling factor (X). The gain scaling factor (X) is determined by the impedance in the feedback path between the output (OUT) and the inverting input (INM).

Switches S81 and S82 are arranged to change the selection of the feedback components (resistors R81 and R82) to adjust the gain scaling factor (X). The selected feedback component is resistor R81 when switch S81 is closed, while the selected feedback component is resistor R82 when switch S82 is closed. The relationship between the input signal (IN) and the output signal (OUT) is determined by the feedback components and the switches as follows: OUT=IN * (1+X), where X is determined by the feedback components. In one example, X=R81/R83 when switch S1 is closed and switch S2 is open. In another example, X=R82/R83 when switch S2 is closed and switch S1 is open.

BRIEF DESCRIPTION OF THE DRAWINGS

Non-limiting and non-exhaustive embodiments are described with reference to the following drawings.

DETAILED DESCRIPTION

Figure 1A:
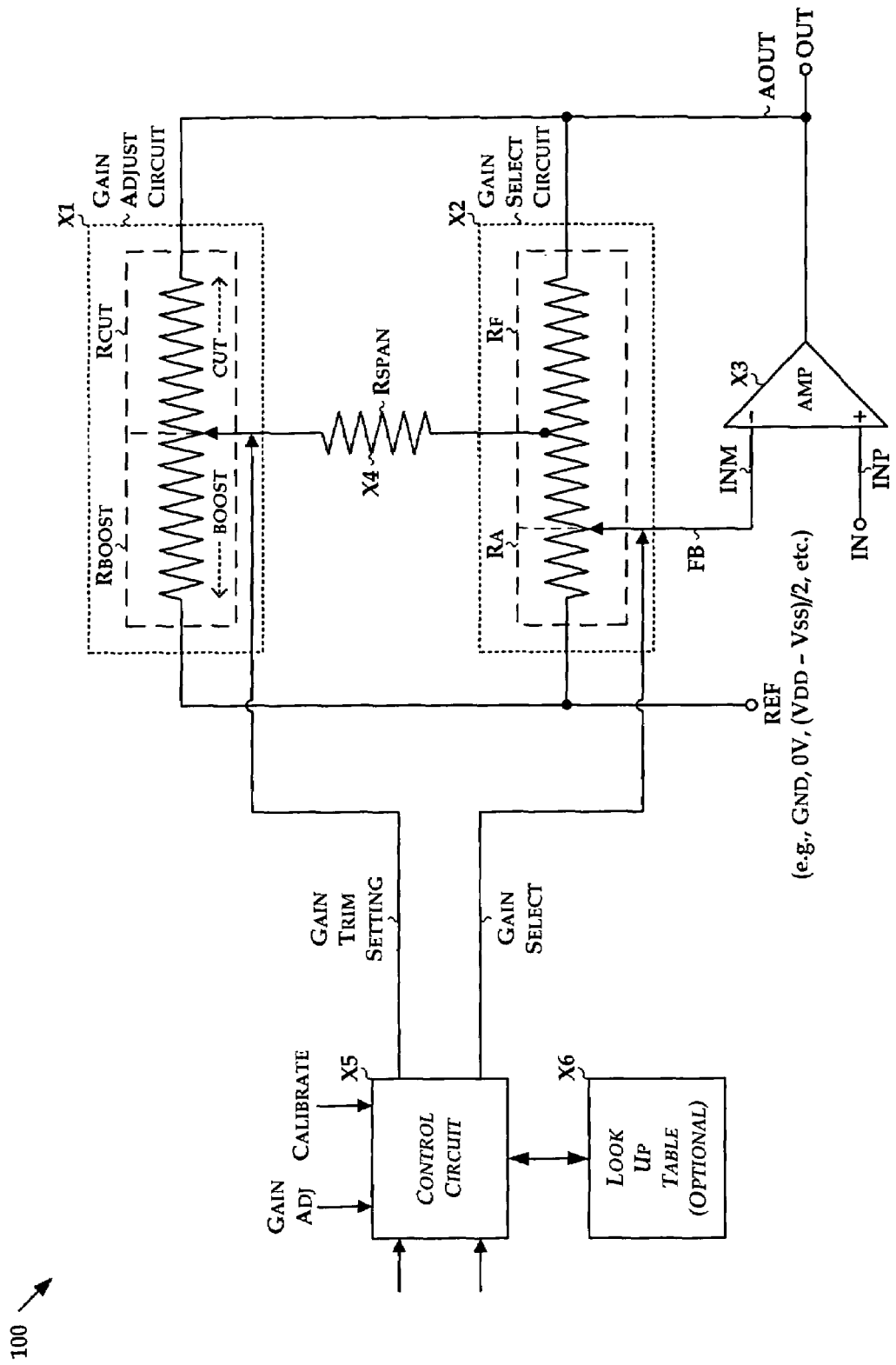
FIG. 1A-1B are schematic diagrams illustrating example programmable gain amplifier circuits.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electromagnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity.

Briefly stated, the present disclosure generally relates to an apparatus and method for trimming gain adjustments in a programmable gain amplifier (PGA). An example PGA circuit includes a gain adjust circuit and a gain select circuit that are both coupled to an output of an amplifier. The gain select circuit completes feedback to the amplifier while the gain adjust circuit is arranged to boost or cut the gain of the gain selection circuit. The gain adjust circuit can be arranged as a trim adjustment to the overall gain of the PGA circuit, where a different trim adjustment can be mapped to each gain setting such as from a look-up table. In other example implementations, the PGA circuit can periodically switch between multiple gain settings using a modulation scheme such that the overall gain is blended between the various gain settings according to a duty cycle or other modulation technique such as pulse-width, delta-sigma, etc. In still a further implementation, the modulation scheme can be arranged to utilize a time averaging effect on the overall gain of the PGA circuit.

Overview

Monolithic amplifiers are often used in applications that require precision signal gain. These amplifiers routinely employ resistive feedback voltage divider elements, such as thin film resistors to control the overall signal gain. Although steps are taken to get accurate feedback ratios, resistor mismatches can result in significant overall amplifier gain error. Examples of conditions that disturb resistor ratios include both processing related differences as well as operating condition related differences. Example processing differences include processing gradients and variations in: sheet resistance (sheet rho), doping concentrations, parasitic capacitances, parasitic resistances, parasitic inductances, and parasitic leakages, to name a few. Example operating condition related differences include: temperature differences between resistors (thermal gradients), and operating voltage differences between resistors (voltage coefficient effects), to name a few.

Continuous laser trim of thin film resistance has been used in the past to correct for gain errors resulting from resistor mismatches. However, a variety of manufacturing costs such as test time, test equipment, laser trimming equipment, and other manufacturing costs can make such trimming techniques cost prohibitive for many markets. The process of trimming micro-electronic circuits (ICs) can also result in disturbances in the circuits that limit the accuracy of trimming, or extend the times necessary to perform trimming (again increasing costs).

Other manufacturing stresses can occur that reduce the accuracy of trimming. Laser trimming is typically performed on a semiconductor wafer prior to dicing the wafer into pieces called die. Example semiconductor processing steps include, dicing the wafer, attaching the die in a package with an epoxy, or perhaps a eutectic attachment, bonding the pads on the die to a lead-frame, forming and sealing the package, as well as others. Each of these semiconductor processing steps can produce die stresses (e.g., surface tension, sheering, bending, micro-cracking, etc.) that can change the overall values of the feedback elements and therefore directly affect post wafer trim gain accuracy.

The present disclosure contemplates each of the above described problems, as well as others, and provides a means for trimming and/or adjusting the gain in a programmable amplifier circuit with a digital means. The digital means can include a means for adjusting a gain trim for a selected gain setting when the gain setting is selected for the programmable gain amplifier. The gain trim can be used to boost or cut the gain according to a predetermined amount such that the desired overall gain is achieved. The digital means can be comprised of circuits that are adapted to adjust the overall gain of the programmable gain amplifier in response to one or more digital control signals. Each digital control signal can be provided by any number of input means such as, for example, from a pin or pad associated with the wafer, from a decoder logic circuit that receives a digital signal (or signals) and generates another digital signal (or signals), and from an analog-to-digital converter that receives an analog input signal and generates one or more digital control signals. The application of digital gain adjustment and trimming increases the number of opportunities for accurate signal amplification, including in-circuit calibration methods.

Trimmed Gain Amplifier

FIG. 1A is a schematic diagram illustrating an example programmable gain amplifier circuit (100) that is arranged according to at least one aspect of the present disclosure. Programmable gain amplifier circuit 100 includes a gain adjust circuit (X1), a gain select circuit (X2), an operational amplifier (AMP, X3), a resistor (RSPAN, X4), a control circuit (X5), and an optional look-up table (X6). In some implementations resistor X4 can be replaced with a wire, effectively a resistance of 0 ohms.

The operational amplifier (X3) includes a non-inverting input terminal (INP), an inverting input terminal (INM), and an output terminal (AOUT). The gain adjust circuit (X1) is coupled between AOUT and a reference terminal (REF). The gain select circuit is also coupled between AOUT and the reference terminal (REF). The resistor (X4) is coupled between a first tap-point terminal in the gain adjust circuit (X1) and a second tap point terminal in the gain select circuit (X2). The control circuit is arranged to receive input signals (e.g., GAIN ADJ, CALIBRATE, etc.) and provide a first control signal (GAIN TRIM SETTING) to the gain adjust circuit (X1) and a second control signal (GAIN SELECT) to the gain select circuit (X2). Optionally, the control circuit (X5) is arranged to interact with the look-up table (X6) to store and/or retrieve previously determined values associated with the first and second control signals.

The reference terminal (REF) is configured to couple a reference voltage (e.g., VREF) to the programmable gain amplifier circuit (100). The reference voltage can be any appropriate ground reference voltage (GND) such as, for example, 0V, a high power supply voltage (e.g., VDD), a low power supply voltage (e.g., VSS), a mid-supply voltage (e.g., [VDD−VSS]/2), etc.

The gain adjust circuit (X1) is configured similar to a potentiometer, where the wiper position corresponds to a variable tap point that is coupled to one side of resistor X4. The total resistance associated with the gain adjust circuit (X1) is the sum of two resistance values corresponding to RBOOST and RCUT. The specific resistance values associated with RBOOST and RCUT are variable in response to the first control signal (GAIN TRIM SETTING) such that a desired tap-point can be achieved analogous to adjusting the wiper position on a potentiometer. The gain adjust circuit (X1) is arranged to respond to the first control signal (GAIN TRIM SETTING), which can be implemented as one or more digital control signals.

The gain select circuit (X2) is also configured similar to a potentiometer, where a fixed tap point in the potentiometer is coupled to the other side of resistor X4, and where a variable tap-point in the potentiometer is coupled to the inverting input terminal (INM) of the operational amplifier circuit (X3). The variable tap-point is similar to a wiper position on a potentiometer. The total resistance associated with the gain select circuit (X2) is the sum of two resistance values corresponding to RA and RF. The specific resistance values associated with RA and RF are variable in response to the second control signal (GAIN SELECT) such that a variable tap-point can be achieved analogous to adjusting the wiper position on a potentiometer. The gain select circuit (X2) is arranged to respond to the second control signal (GAIN TRIM SETTING), which can be implemented as one or more digital control signals.

An input signal (IN) is coupled to the non-inverting input terminal (INP) of the operational amplifier (X3). The output signal (OUT) for the programmable gain amplifier circuit (100) corresponds to the output of the operation amplifier (AOUT). The gain select circuit (X2) is operated similar to the feedback circuit in a non-inverting amplifier, where the inverting input terminal (INM) is operated as the feedback point (FB) between two resistors (RA and RF). The gain select circuit (X2) adjusts the values associated with the two resistors (RA and RF) in response to the second control signal (GAIN SELECT) to achieve a desired gain setting for the programmable amplifier circuit (100). The desired gain is determined by the equation: OUT=IN*(1+RF/RA).

The gain adjust circuit (X1) is arranged to cooperate with the gain select circuit (X2) to modify the overall gain of the programmable gain amplifier circuit (100) from the selected gain setting (i.e., Gain=1+RF/RA) by boosting or cutting the gain by a desired amount. The resistance values associated with the gain select circuit (X2) are approximately in parallel with the resistance values of the gain adjust circuit (X1). The amount of boosting and cutting in the ideal gain is determined by the resistance values RBOOST and RCUT. When the wiper position is moved in the CUT direction, resistance RCUT decreases in value resistance while RBOOST simultaneously increases in value. When the wiper position is moved in the BOOST direction, RBOOST decreases in value as RCUT increases in value. RBOOST is effectively in parallel with RA such that a lower resistance value for RBOOST decreases the effective resistance value for RA. It is thus seen that a decreasing effective value for RA results in an increase in gain for the programmable gain amplifier circuit (100). Similarly, an increase in the effective value for RA results in a decrease in gain for the programmable gain amplifier circuit (100).

The control circuit (X5) is arranged to vary the control signals to the gain adjust circuit (X1) and the gain select circuit (X2) when a desired gain setting is selected by a user (e.g., via signal GAIN ADJ). When the desired gain setting is selected, the wiper position for the gain setting is selected via the first control signal (GAIN SELECT). A gain adjustment is also made via the second control signal (GAIN TRIM SETTING) so that the overall gain of the programmable gain amplifier circuit (100) is boosted or cut to achieve an accurate overall gain. Each gain setting can have a different predetermined trim amount that corresponds to a paired set of control signals for GAIN SELECT and GAIN TRIM SETTING. The trim amounts can be determined during a calibration sequence as will be discussed later with respect to FIG. 7. The control circuit (X5) can be arranged to operate in a calibration mode such as when the programmable gain amplifier circuit (100) is being tested and in a non-calibration mode when the programmable gain amplifier (100) is being operated by a user.

Adjustments associated with the trimming of the overall gain of the programmable gain amplifier circuit (100) can be stored in a look-up table (X6) such as a fuse map, a dynamic memory, a flash memory, a read only memory (ROM), or some other storage means that can be utilized to store values for later retrieval. The range associated with the trimming adjustments to the selected gain are in part dependent upon the values associated with RSPAN, RBOOST, and RCUT. In one example, the selected gain can be boosted by 10% or cut by 10%. In another example, the selected gain can be boosted by 10% or cut by 5%. Other amounts are also contemplated such that a desired range of gain adjustments are achieved. The trimming between gain settings can be further understood after review of the various circuits and methods described below.

Figure 1B:
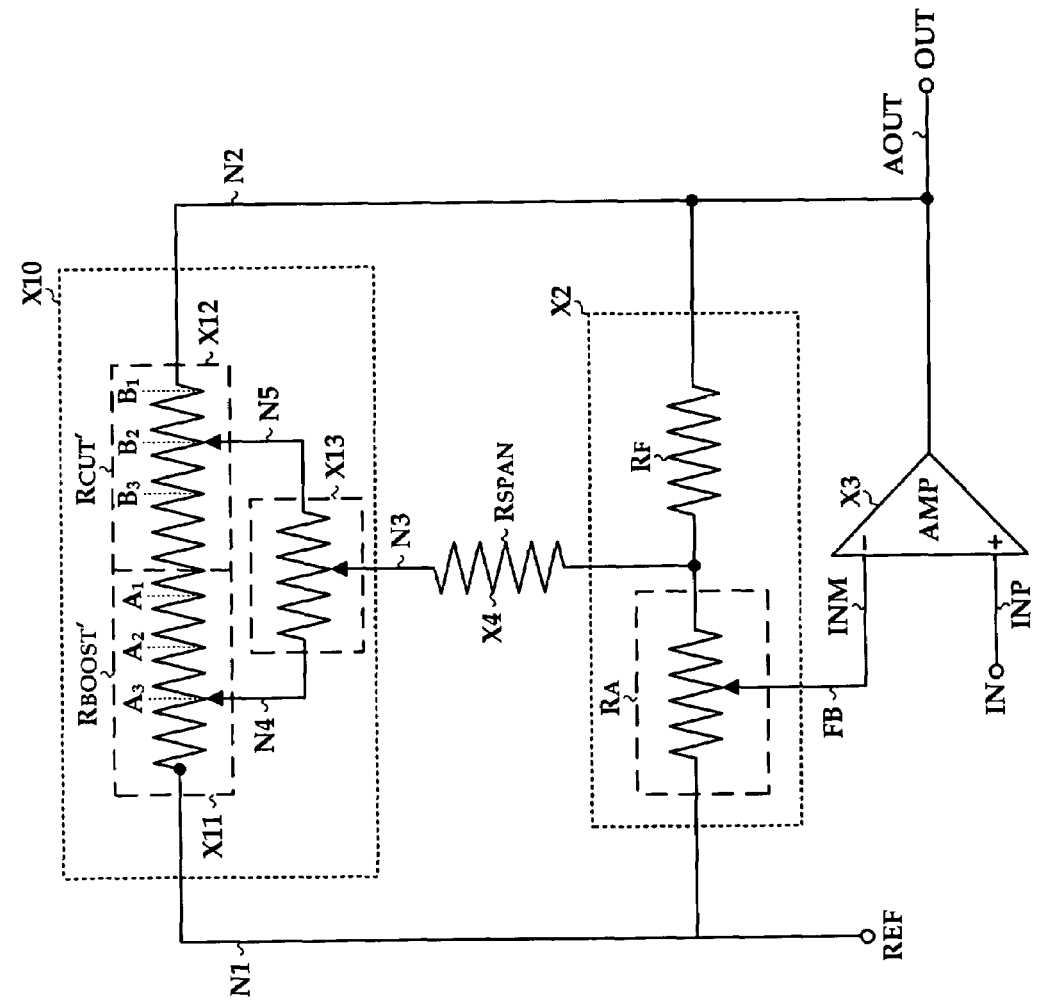

FIG. 1B is a schematic diagram illustrating another example programmable gain amplifier circuit (110) that is arranged according to at least one aspect of the present disclosure. Programmable gain amplifier circuit 110 includes a gain adjust circuit (X10), a gain select circuit (X2), an operational amplifier (AMP, X3), and a resistor (RSPAN, X4). In FIG. 1B, the gain adjust circuit (X1) from FIG. 1A is replaced with another gain adjust circuit (X10) that operates according to the same principals previously described. Additional control circuits and the optional look-up table are not shown, but contemplated as previously described.

The gain adjust circuit (X10) is again arranged to cooperate with the gain select circuit (X2) to modify the overall gain of the programmable gain amplifier circuit (110) from the selected gain setting (i.e., Gain=1+RF/RA) by boosting or cutting the gain by a desired amount. The resistance values associated with the gain select circuit (X2) are approximately in parallel with the resistance values of the gain adjust circuit (X10). For FIG. 1B, the amount of boosting and cutting in the ideal gain is again determined by the effective resistance values for RBOOST and RCUT. However, the effective resistance values for RBOOST and RCUT are determined by three variable resistance circuits (X11, X12 and X13).

The gain select circuit (X10) is again coupled between the output terminal (AOUT) and the reference terminal (REF), where node N1 corresponds to the reference terminal (REF) and node N2 corresponds to the output terminal (AOUT). Variable resistance circuits X11 and X12 are series coupled between nodes N1 and N2 as illustrated. Variable resistance circuits X11 and X12 include adjustable wiper positions that are coupled to nodes N4 and N5, respectively. Variable resistance circuit X13 is coupled between nodes N4 and N5, and includes an adjustable wiper position that is coupled to node N3. Node N3 corresponds to the resistor (RSPAN, X4) that couples the gain select circuit (X10) to the gain select circuit (X2).

In operation, variable resistance circuits X11-X13 are arranged to provide the effective resistance values for RBOOST and RCUT such as illustrated in FIG. 1A. The resistance looking into node N3 with respect to node N1 corresponds to the effective resistance value for RBOOST, while the resistance looking into node N3 with respect to node N2 corresponds to the effective resistance value for RCUT. To reflect the relationship between FIGS. 1A and 1B, variable resistance circuit X11 is labeled as RBOOST' and variable resistance circuit X12 is labeled as RCUT'.

When the wiper position for variable resistance circuit X12 is moved in the CUT' direction, the effective resistance value for RCUT decreases, while RBOOST simultaneously increases in value. When the wiper position for variable resistance circuit X11 is moved in the BOOST' direction, the effective resistance value for RBOOST decreases as the effective resistance value for RCUT increases. The wiper position for variable resistance circuit X13 can also be moved towards RCUT' or RBOOST' to similarly adjust the effective resistance values for RCUT and RBOOST.

The effective resistance value of RBOOST is again in a parallel configuration with respect to resistance RA, while the effective resistance value of RCUT is again in a parallel configuration with respect to resistance RF. A decreasing effective value for RA again results in an increase in gain, while an increasing effective value for RA results in a decrease in gain for the programmable gain amplifier circuit (110). A decreasing effective value for RF again results in an decreased in gain, while an increasing effective value for RF results in an increased in gain for the programmable gain amplifier circuit (110).

Figure 1C:
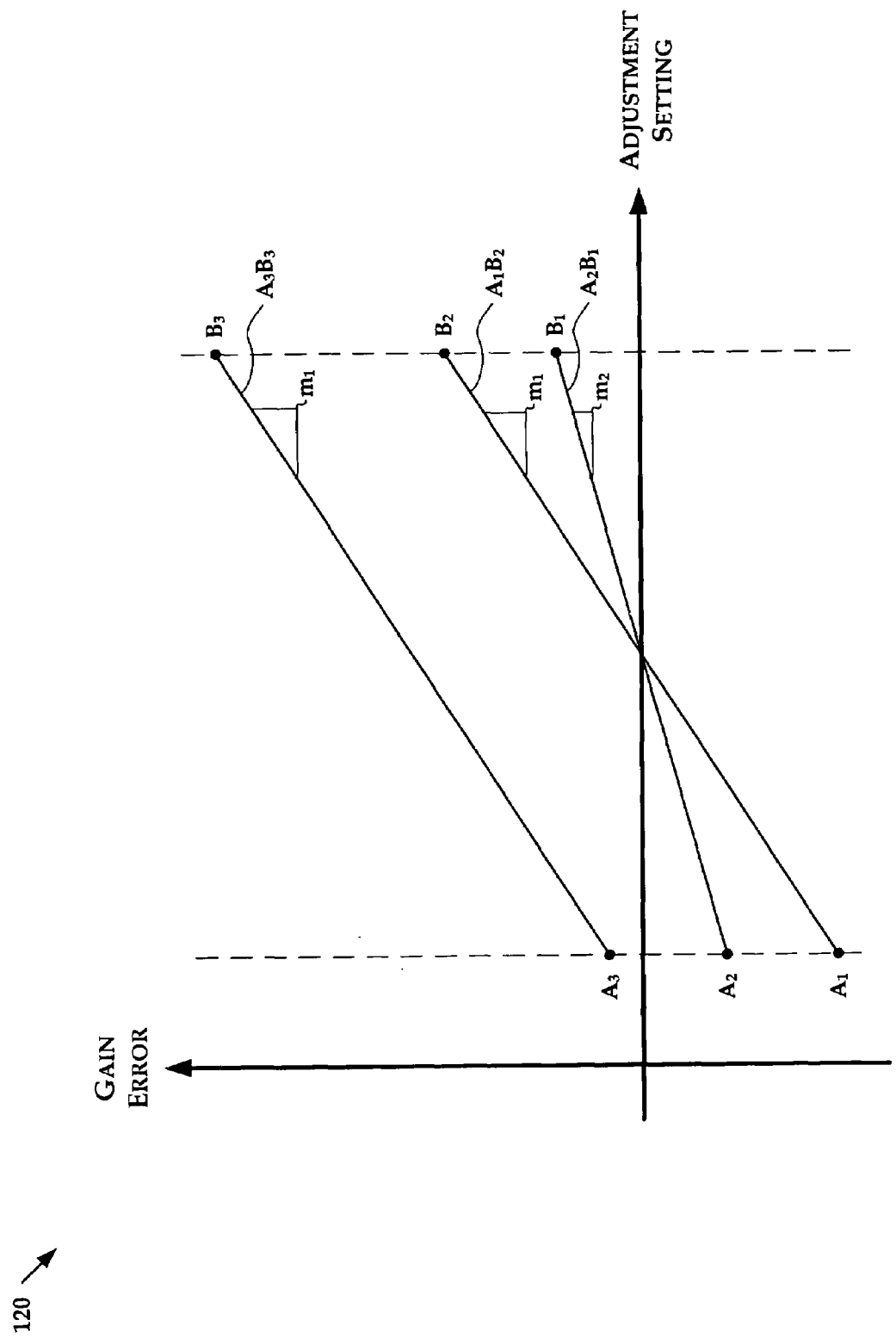
FIG. 1C is a graph illustrating gain error effects for an example programmable gain amplifier circuit.

FIG. 1C is a graph (120) illustrating gain error effects for example programmable gain amplifier circuits, such as that described in FIG. 1B.

Gain error in FIG. 1C is determined as the difference between the desired gain setting and the actual gain setting that is achieved in a manufactured circuit. In some examples, the gain error can be reduced by increasing the effective gain setting from the gain adjust circuit (e.g., X1 or X10), while in other examples the gain error can be reduced by decreasing the effective gain setting. Moreover, the slope of the gain error can also be changed by varying the settings for the gain adjust circuit (e.g., X10).

As illustrated in FIG. 1B, variable resistance circuit X11 includes at least three example wiper positions (A1, A2 and A3), while variable resistance circuit X12 is includes at least another three wiper positions (B1, B2 and B3). The effective resistance between nodes N1 and N4 are lowest at wiper position A3, higher at wiper position A2, and highest at wiper position A1. The effective resistance between nodes N5 and N2 are lowest at wiper position B1, higher at wiper position B2, and highest at wiper position B3.

For FIG. 1C, the gain adjustment settings of gain adjust circuit X10 of FIG. 1B has wiper settings corresponding to position pairs A3, B3; A2, B1; and A1, B2. The gain error for wiper position pair A3, B3 has a slope corresponding to m1. For this example, a decrease in overall gain error occurs when wiper position pair A1, B2 is selected, where the overall slope remains approximately at m1. Changing from wiper position pair A1, B2 to wiper position pair A2, B1 results in a decrease in the overall slope from m1 to m2, as illustrated. As illustrated by FIGS. 1B and 1C, moving the wiper position settings closer to the common node between variable resistance circuits X11 and X12 results in a decrease in overall gain adjustment range as is reflected by the gain error slope decreasing. Similarly, moving the wiper positions further apart from the common node results in an increase in overall gain adjustment range as is reflected by the gain error slope increasing. Moving the wiper positions together towards node N1 tends to move the overall gain adjustment towards boost while maintaining a similar slope.

Digitally Adjusted Resistor Circuits

Figure 2:
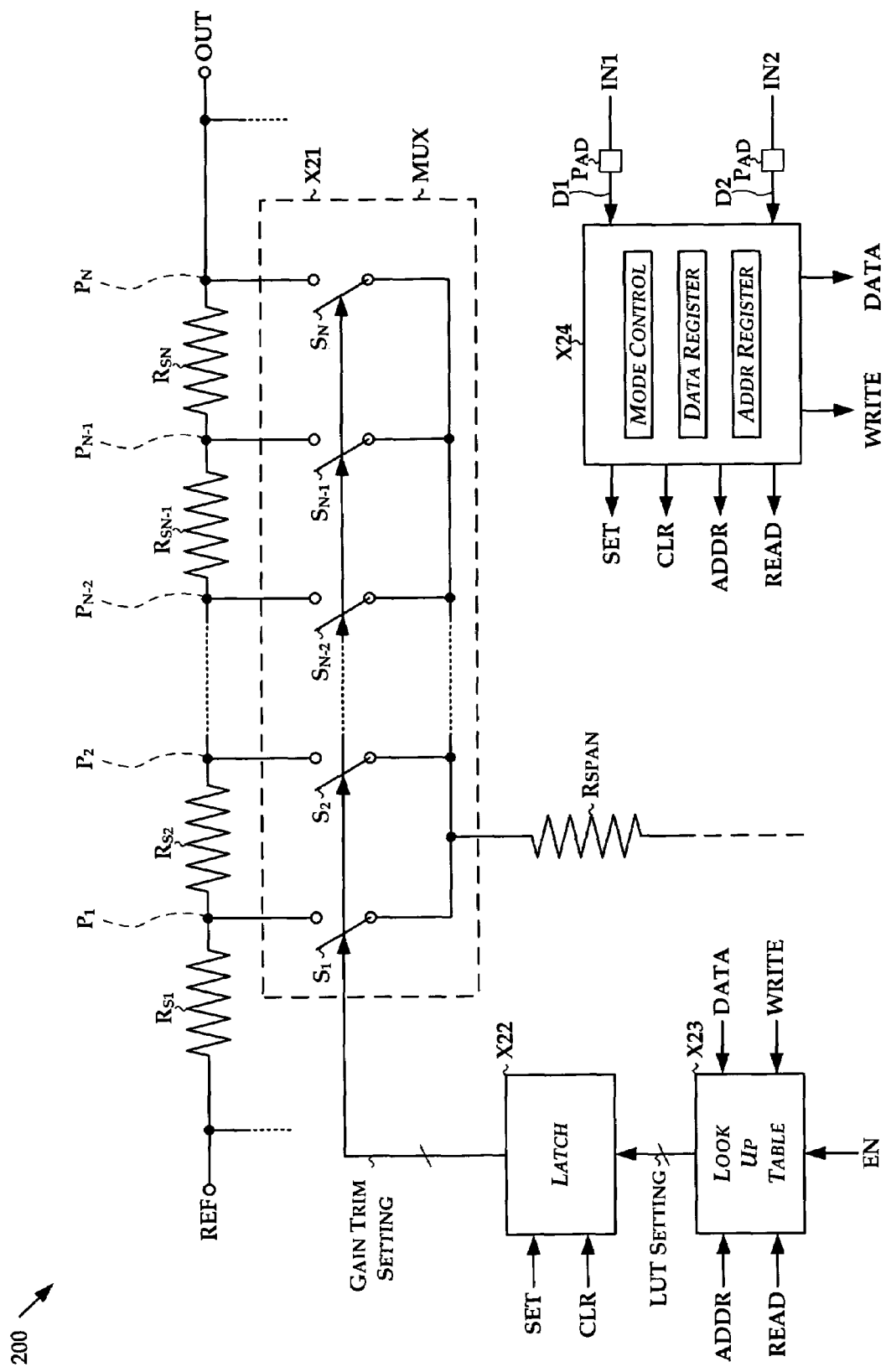
FIG. 2 is a schematic diagram illustrating an example adjustable resistor topology in another example programmable gain amplifier circuit.

FIG. 2 is a schematic diagram illustrating an example adjustable resistor topology (200) in another example programmable gain amplifier circuit that is arranged according to at least one aspect of the present disclosure. Adjustable resistor topology 200 includes an array of N-series coupled resistors (RS1-RSN) and a multiplexer circuit (MUX, X21). An example latch circuit (X22), look-up table (X23) and control circuit (X24) are also illustrated in FIG. 2.

Resistors RS1-RSN are series coupled between REF and OUT. Resistor RS1 is coupled between REF and node P1. Resistor RS2 is coupled between node P1 and node P2. Resistor RSN-1 is coupled between node PN-2 and node PN-1. Resistor RSN is coupled between node PN-1 and PN, where PN is coupled to OUT. Nodes P1 through PN are coupled to multiplexer circuit X21. The multiplexer circuit (X21) is responsive to a control signal (e.g., GAIN TRIM SETTING) to couple one of nodes P1 through PN to resistor RSPAN. The multiplexer circuit (X21) is arranged to cooperate with the array of resistors (RS1-RSN) to provide the necessary functions for a digitally controlled potentiometer.

The multiplexer circuit (X21) is illustrated as an array of controlled switches (S1-SN), where each switch is arranged to couple a respective one of nodes P1 through PN to resistor RSPAN. The array of switches is intended to provide an example of the function provided by the multiplexer. Such functions may be provided by transistors, transmission gates, logic circuits, and other circuits that are arranged to provide a multiplexer functionality without departing from the spirit of the present disclosure.

Any number of resistors and switches can be utilized to achieve a desired number of tap points and a desired range of adjustability. The values associated with the resistors can be selected to achieve a desired granularity. In one example, equal valued resistors are selected. In another example, each resistor is related to a preceding resistor according to a binary scaling (e.g., 1×, 2×, 4×, etc.). In still another example, each resistor is related to a preceding resistor according to a linear scaling factor. In yet another example, each resistor is related to a preceding resistor according to a logarithmic scaling factor. Other arbitrarily assigned values can also be selected as may be desired.

In one example, the multiplexer circuit is controlled by a GAIN TRIM SETTING control signal that is provided by latch X22. Latch 22 can be set or cleared via control signals from the control circuits (X24). When the set signal is asserted, latch 22 stores a value (LUT Setting) that is provided by look-up table X23, which is also controlled by the control circuit (X24) such as via signals READ, WRITE, ADDR, DATA and EN.

An example look-up table (X24) can be implemented as a programmable read only memory, or some other programmable storage means. Each address (ADDR) can be associated with a particular gain setting for the programmable gain amplifier circuit. When an ADDR is used to access the look-up table (e.g., asserting the READ and EN signals when ADDR is ready), a look-up table setting value is retrieved for the associated gain setting. In some implementations, values can be stored in the look-up table (X23) using DATA to store the value associated with ADDR when the WRITE signal and EN signal are asserted. The described example is intended as a non-limiting example of a look-up table, and many other examples are contemplated such as read-only memory (ROM), random access memory (RAM), flash memory, programmable logic array (PLA), to name a few.

An example control circuit (X24) can be adapted to receive input signals (e.g., IN1, IN2, etc.) from one or more pads associated with an integrated circuit. The pads may be accessed using wafer probing techniques, using pins associated with the packaged integrated circuit, or via some other mechanism. Signals (e.g., D1, D2, etc.) received by control circuit X24 are processed to provide the necessary control signals for testing gain/trim settings, storing calibration data, and for operating the programmable gain amplifier circuit. A mode control functional block can be utilized to identify and select an operating mode for the programmable gain amplifier circuit. Example modes include a test mode where the user can manually select gain and trim values, a store mode where the user can store settings associated with a trim value for a gain setting, and an operational mode where the user can program the gain of the programmable gain amplifier circuit using previously stored calibration trim values. An address register can be used to provide values for accessing the look-up table (X3). A data register can be used to provide values for storing in the look-up table (X3). When the testing mode is enabled, the control circuit can be used to select each trim setting for a respective gain setting in the programmable gain amplifier circuit.

Figure 3A:
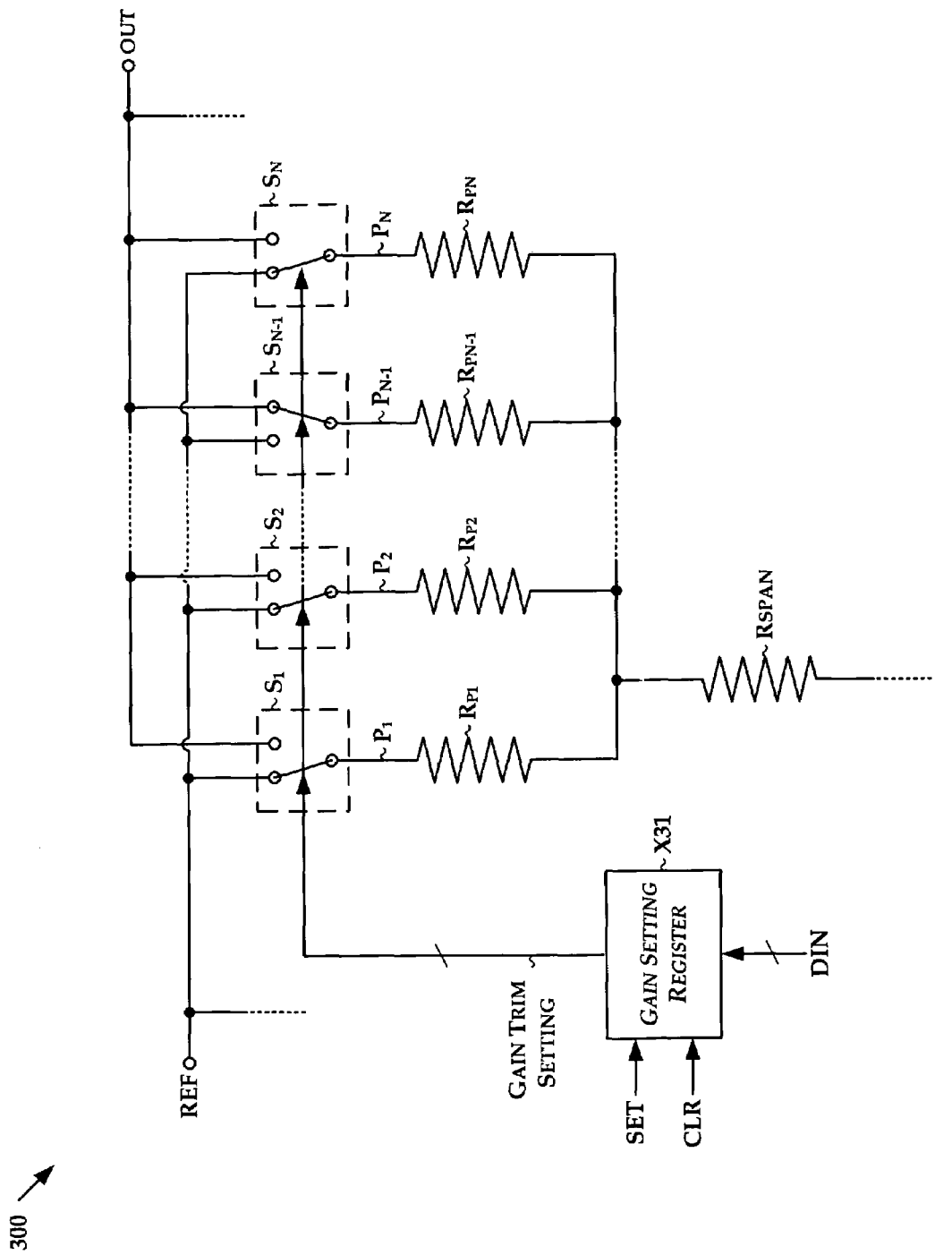
FIGS. 3A-3B are schematic diagrams illustrating example adjustable resistor topologies for example programmable gain amplifier circuits.

FIG. 3A is a schematic diagram illustrating another example adjustable resistor topology (300) in still another example programmable gain amplifier circuit that is arranged according to at least one aspect of the present disclosure. Adjustable resistor topology 300 includes an array of N-parallel configured resistors (RP1-RPN) and a multiplexer/selector circuit. An example register circuit (X31) is illustrated for a latching means that stores the gain trim setting control signal in FIG. 2.

Resistors RP1-RPN are arranged in a parallel configuration, where each resistor includes a first terminal that is coupled in common to resistor RSPAN. The multiplexer/selector circuit is coupled to a second terminal for each resistor at nodes P1-PN. The multiplexer/selector circuit is arranged to selectively couple each resistor to one of two nodes, one node corresponding to REF and the other node corresponding to OUT.

The multiplexer/selector circuit is illustrated as switching circuits S1-SN, where each switching circuit is associated with a respective one of resistors RP1-RPN. Each switching circuit is illustrated as a two-position switch, however the circuits are intended as a functional illustration that can be implemented as transistors, transmission gates, digital logic, and any other circuits configured to provide the desired functionality. The switching circuits are responsive to the control signal (e.g., GAIN TRIM SETTING) to independently couple each node (P1 through PN) to either REF or OUT. The multiplexer/selector circuit is arranged to cooperate with the array of resistors (RS1-RSN) to provide the necessary functions for a digitally controlled potentiometer.

Any number of resistors and switches can be utilized to achieve a desired number of adjustments with a desired range. The values associated with the resistors can be selected to achieve a desired granularity. In one example, equal valued resistors are selected. In another example, each resistor is related to a preceding resistor according to a binary scaling (e.g., 1×, 2×, 4×, etc.). In still another example, each resistor is related to a preceding resistor according to a linear scaling factor. In yet another example, each resistor is related to a preceding resistor according to a logarithmic scaling factor. Other arbitrarily assigned values can also be selected as may be desired.

Figure 3B:
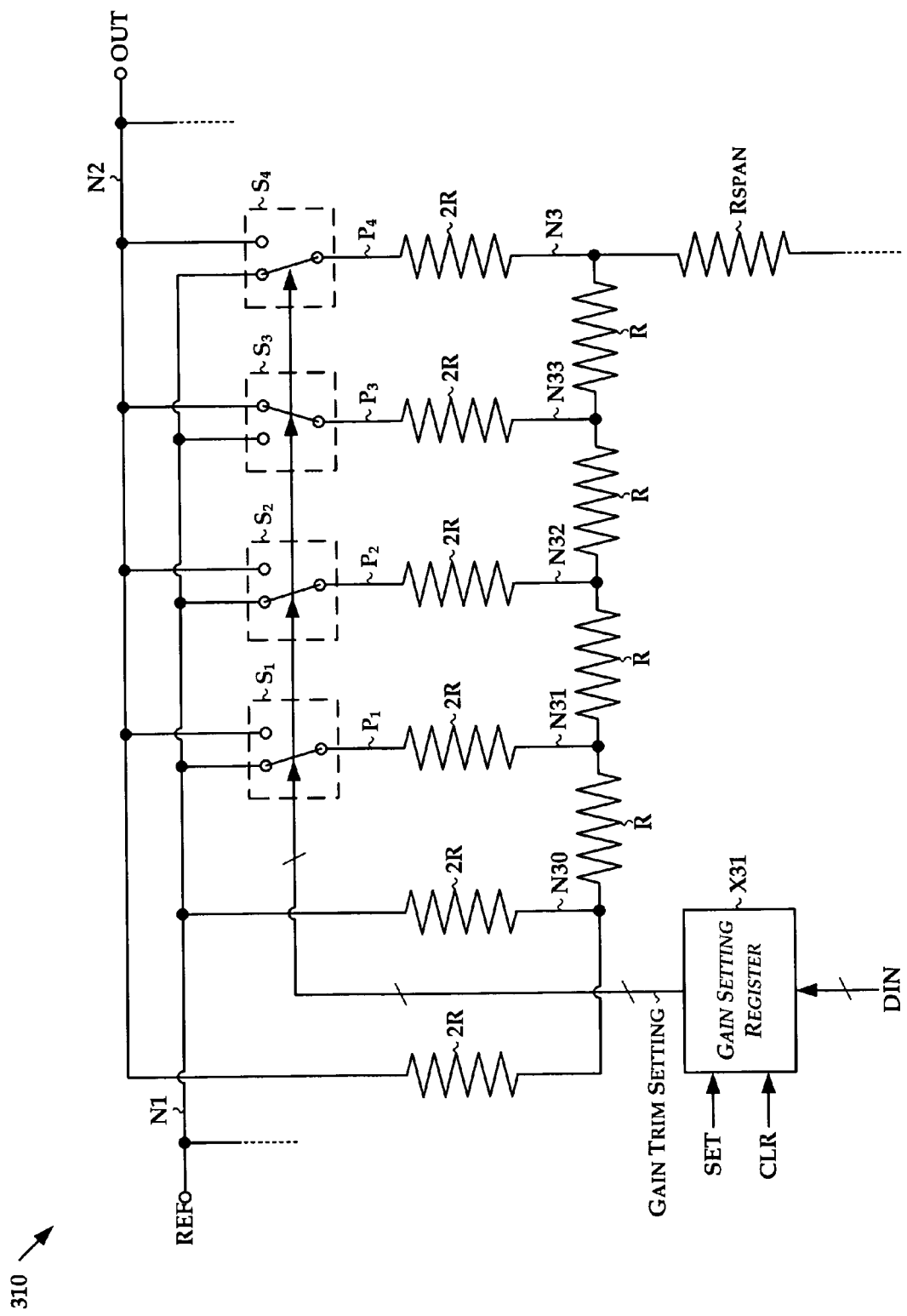

FIG. 3B is a schematic diagram illustrating still another example adjustable resistor topology (310) in another example programmable gain amplifier circuit that is arranged according to at least one aspect of the present disclosure. Adjustable resistor topology 310 is an R-2R resistor ladder circuit, including four selectable nodes (P1-P4) that are selected by a multiplexer/selector circuit. An example register circuit (X31) is again illustrated for a latching means that stores the gain trim setting control signal.

Similar to FIG. 3A, the multiplexer/selector circuit is arranged to selectively couple each selectable node (P1-P4) from the resistor ladder circuit to one of two nodes, one node (N1) corresponding to REF and the other node (N2) corresponding to OUT. The multiplexer/selector circuit is illustrated as switching circuits S1-SN, where each switching circuit is associated with a respective one of resistors in the resistor ladder circuit. The switching circuits are responsive to the control signal (e.g., GAIN TRIM SETTING) to independently couple each node (P1 through PN) to either REF or OUT.

The R-2R resistor ladder circuit includes a node (N3) that is coupled in common to resistor RSPAN. A resistor of value 2R is coupled between each pair of the following node pairs: N3, P4; N33, P3; N32, P2; N31, P1; N30, N1; and N30, N2. A resistor of value R is coupled between each pair of the following node pairs: N3, N33; N33, N32; N32, N31; and N31, N30. Although illustrated as a four bit R-2R ladder, any other number of bits of resolution can be utilized as will be understood to one of skill in the art.

The R-2R ladder circuit is arranged to selectively switch points P1-P4 between nodes N1 and N2 in response to the gain trim setting signal. The effective resistance looking into node N30 corresponds to the parallel combination of 2R and 2R, notated as 2R∥2R, which is equivalent to a value of R. The effective resistance looking into node N31 corresponds to the combination of value R in series with the resistance looking into node N30, notated as R+RN30, which is equivalent to a value of 2R. This process continues up to the resistance looking into node N3, which is again equivalent to a value of 2R.

Each of the figures described can be combined to provide a desired functionality. Additional examples are also contemplated to provide any number of possibilities, including additional mode control circuits, serial control signals, parallel control signals, internally accessed trim tables, externally accessed trim tables, to name a few.

Figure 4:
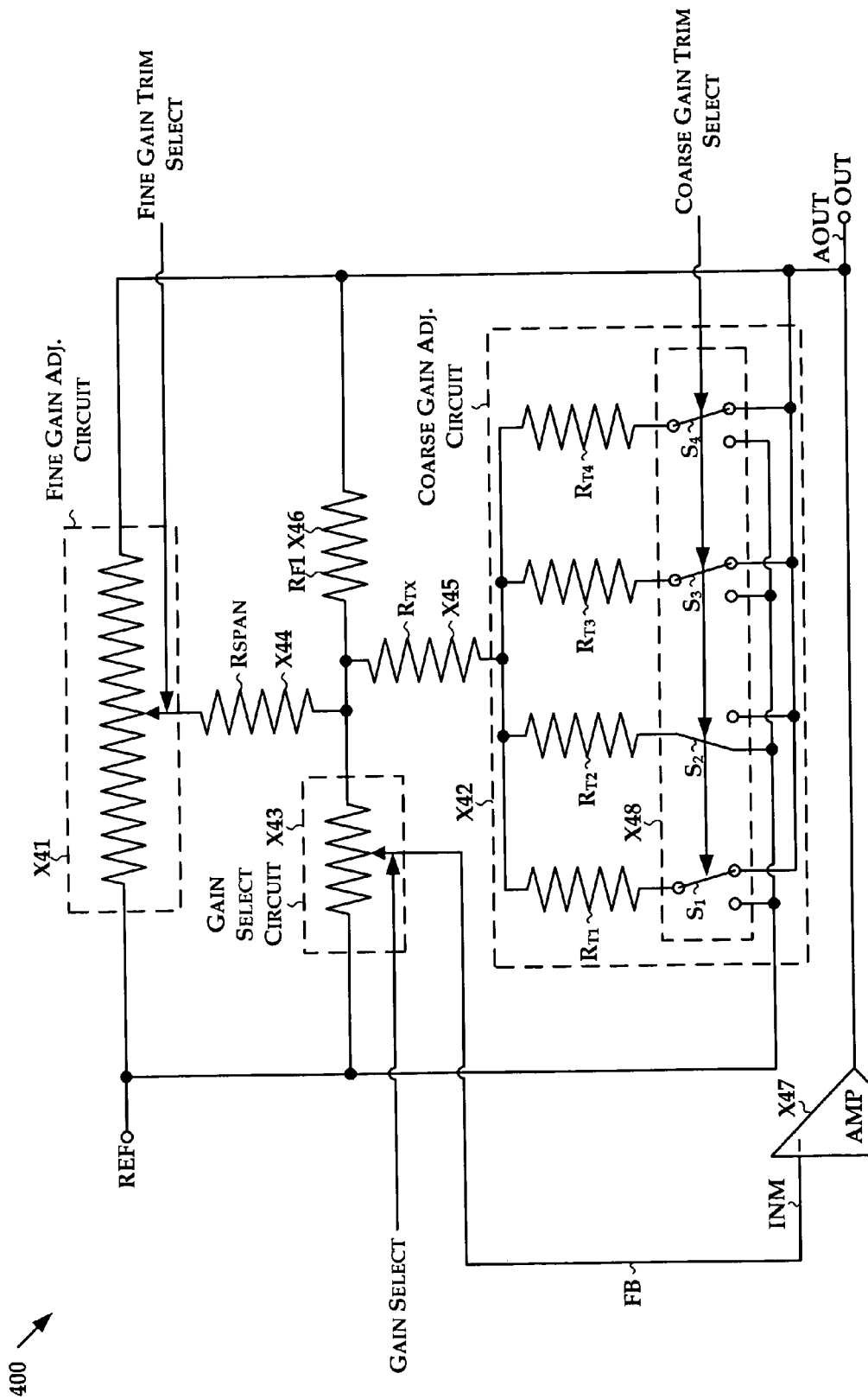
FIG. 4 is a schematic diagram illustrating yet another example adjustable resistor topology in yet another example programmable gain amplifier circuit.

FIG. 4 is a schematic diagram illustrating yet another example adjustable resistor topology (400) in yet another example programmable gain amplifier circuit that is arranged according to at least one aspect of the present disclosure. Resistor topology 400 includes a fine gain adjustment circuit (X41), a coarse gain adjustment circuit (X42), a gain select circuit (X43), three resistors (X44-X46), and an operational amplifier circuit (X47). In some implementations resistors X44 and/or X45 can be replaced by wire, effectively having a resistance of 0 ohms. In some other implementations resistor X46 is combined with the gain select circuit (X43) such as illustrated in FIG. 1A or FIG. 1B.

The operational amplifier (X47) includes a non-inverting input terminal (INP), an inverting input terminal (INM), and an output terminal (AOUT). The coarse gain adjust circuit (X42) and the fine gain adjust circuit (X41) are coupled between AOUT and a reference terminal (REF). The gain select circuit is also coupled between AOUT (via resistor X46) and the reference terminal (REF). Resistor X44 is coupled between a first fine adjust tap-point terminal in the fine gain adjust circuit (X41) and the tap point between the gain select circuit (X42) and resistor X46. Resistor X45 is coupled between a coarse adjust tap-point terminal in the coarse gain adjust circuit (X42) and the tap point between the gain select circuit (X42) and resistor X46.

The reference terminal (REF) is configured to couple a reference voltage (e.g., VREF) to the programmable gain amplifier circuit (100). The reference voltage can be any appropriate ground reference voltage (GND) such as, for example, 0V, a high power supply voltage (e.g., VDD), a low power supply voltage (e.g., VSS), a mid-supply voltage (e.g., [VDD−VSS]/2), etc.

The example illustrated in FIG. 4 is substantially similar to the examples of FIGS. 1A and 1B, with the modification of the gain adjustment circuit to include coarse and fine adjustment means. The gain select circuit (X43) is again configured similar to a potentiometer, where a variable tap-point in the potentiometer is coupled to the inverting input terminal (INM) of the operational amplifier circuit (X47) to provide a feedback signal (FB). An input signal (IN) is again coupled to the non-inverting input terminal (INP) of the operational amplifier (X47).

The fine gain adjust circuit (X41), coarse gain adjust circuit (X42), and the gain select circuit (X43) are all configured to operate as digitally controlled potentiometers similar to those previously discussed. The wiper of the fine adjust circuit (X41) is adjusted in response to a first control signal (FINE GAIN TRIM SELECT), while the wiper of the coarse gain adjust circuit (X42) and the wiper of the gain select circuit (X43) are adjusted in response to second and third control signals (COARSE GAIN TRIM SELECT, GAIN SELECT). In one example, the fine gain adjust circuit (X41) is implemented as an array of series configured resistors while the coarse gain adjust circuit (X43) is implemented as an array of parallel configured resistors. Other examples are also contemplated where all of the adjustable resistor circuits may be different topologies from one another or the same topologies as one another.

Modulated Gain Adjustment

Figure 5A:
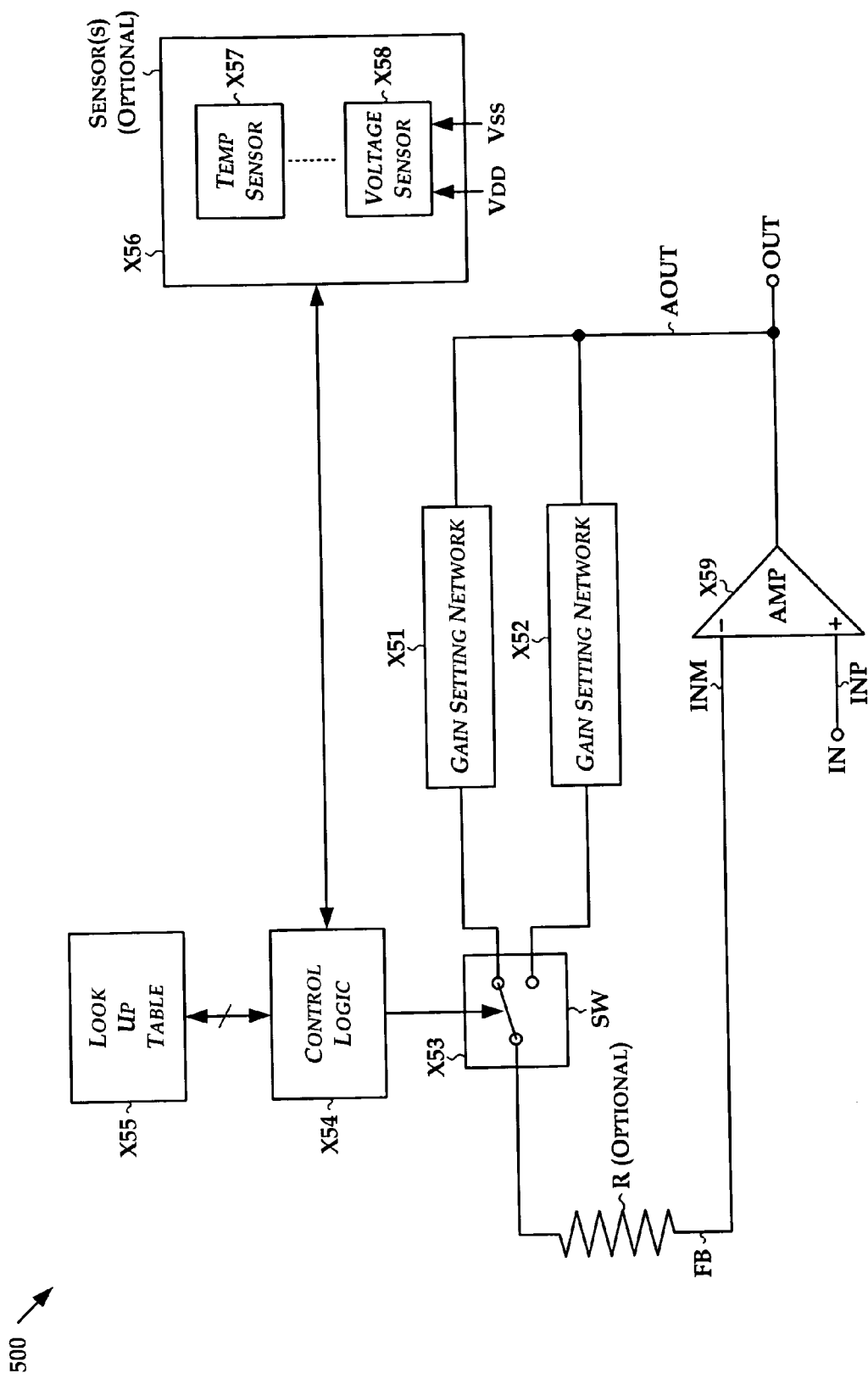
FIGS. 5A-5C are schematic diagrams illustrating example programmable gain amplifier circuits that employ a modulation topology.

FIG. 5A is a schematic diagram illustrating another example programmable gain amplifier circuit (500) that employs a modulation topology according to at least one aspect of the present disclosure. Programmable gain amplifier circuit 500 includes a first and second gain setting network (X51, X52), a switching circuit (SW, X53), a control logic circuit (X54), an optional look-up table (X55), an optional sensor circuit (X56), an optional resistor (R), and an operational amplifier circuit (X59). The sensor circuits can be of any variety of sensors such as, but not limited to, a temperature sensor (X57), a voltage sensor (X58), etc.

The operational amplifier circuit (X59) includes a non-inverting input terminal (INP), an inverting input terminal (INM), and an output terminal (AOUT). The first gain setting network (X51) is coupled between a first terminal of the switching circuit (X53) and the output terminal (AOUT) of the operational amplifier (X59). The second gain setting network (X52) is coupled between a second terminal of the switching circuit (X53) and the output AOUT) of the operational amplifier (X59). The switching circuit (X53) also includes a third terminal that is coupled to the inverting input (INM) of the operational amplifier through optional resistor R.

In operation, the switching circuit is arranged to couple one of the first and second terminals to the third terminal of the switching circuit (X53). When the first terminal is coupled to the third terminal, the overall gain of the programmable gain amplifier circuit (500) corresponds to the gain setting that is provided by the first gain setting network (X51). When the second terminal is coupled to the third terminal, the overall gain of the programmable gain amplifier circuit (500) corresponds to the gain setting that is provided by the second gain setting network (X52). The control logic circuit (X54) is arranged to provide a gain control signal to the switching circuit such that a desired blend is achieved between the gain from the first gain setting network (X51) and the gain from the second gain setting network (X52). By modulating the pulse width (or the average pulse density such as in the case of time averaged over-sampling modulation schemes such as sigma-delta modulation) associated with the gain control signal any desired blend between the gains can be achieved. The optional look-up table can again be used to retrieve values associated with a trimmed gain. For this example, the trimmed values correspond to a duty cycle setting.

In one example, a first gain setting network (X51) is arranged to provide a gain of 1.5 and a second gain setting network (X52) is arranged to provide a gain of 2.5. When the duty cycle is set to 0%, the overall gain is simply 1.5. Similarly, when the duty cycle is set to 100%, the overall gain is simply 2.5. However, when the duty cycle is set to 50%, the overall gain of the programmable gain amplifier circuit (500) corresponds to 2.0. By varying the duty cycle between 0% and 100%, the gain can be effectively adjusted between 1.5 and 2.5. A wide range of adjustments can be made without any additional circuit modifications simply by varying the duty cycle of the modulation between the first and second gain settings.

In some examples, the control logic circuit can be arranged to evaluate operating conditions associated with the circuit such as by monitoring voltages, currents, operating temperatures, etc. provided from a sensor circuit (X56). Various changes to the modulation can be made by the control logic circuit (X54) based on the dynamically measured operating conditions. In this way, the gain of the programmable gain amplifier circuit (500) can be carefully controlled. In some instances, it may be desirable to change to the modulation technique when one of the monitored operating conditions changes beyond a predetermined threshold.

Figure 5B:
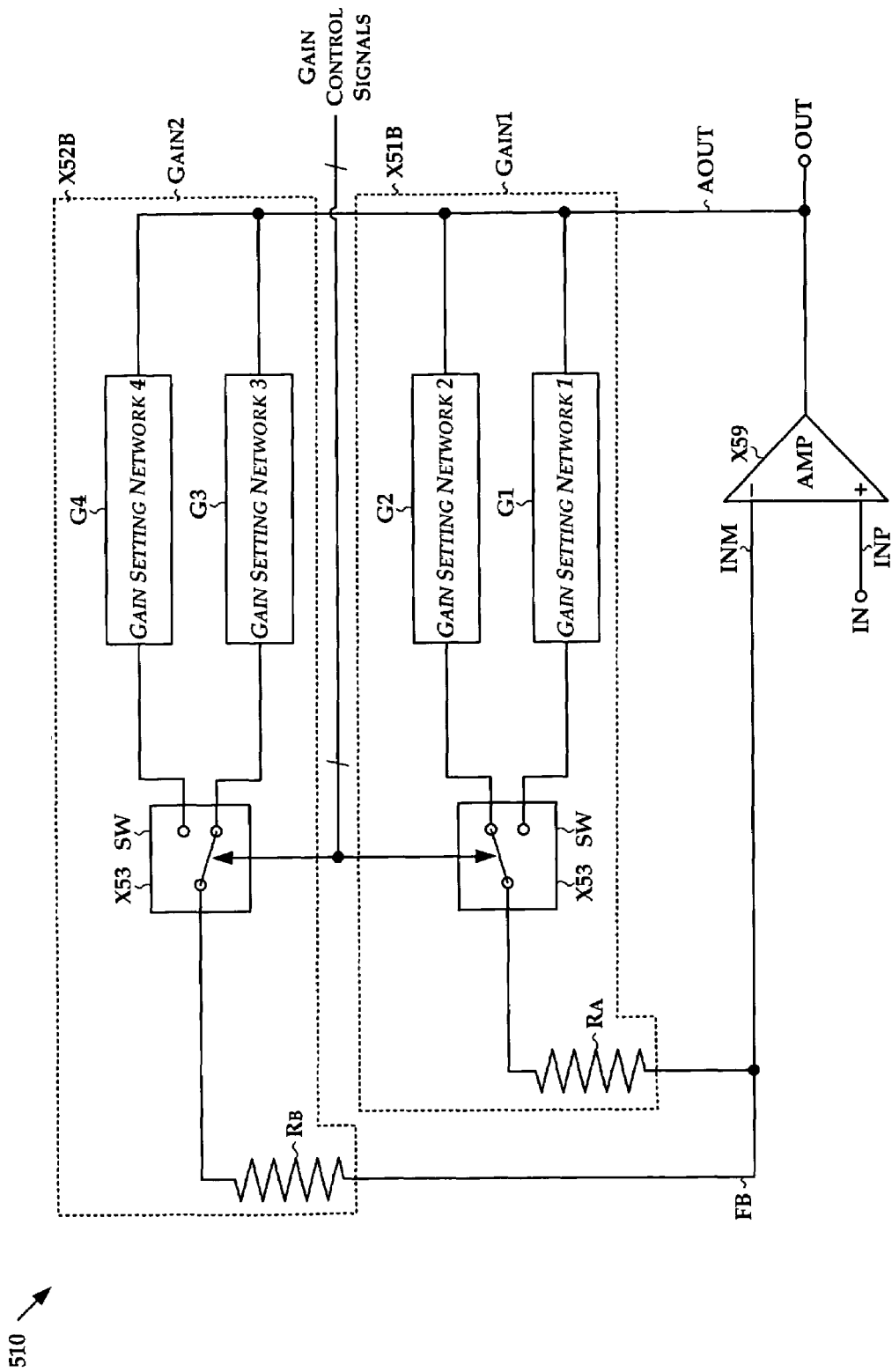

FIG. 5B is a schematic diagram illustrating still another example programmable gain amplifier circuit (510) that employs a modulation topology according to at least one aspect of the present disclosure. Programmable gain amplifier circuit 510 includes a first and second gain setting circuit (X51B, X52B), and an operational amplifier circuit (X59), arranged similar to FIG. 5A. Each gain setting circuit includes a switching circuit (SW, X53), an optional resistor (RA, RB), and two gain setting networks (X51B, X52B).

The first gain setting circuit (X51B) includes gain setting networks 1 and 2, with corresponding gain values of G1 and G2, respectively. The second gain setting circuit (X52B) includes gain setting networks 3 and 4, with corresponding gain values of G3 and G4 respectively. Each gain setting network is selectively coupled between nodes INM and AOUT via their respective switching circuit (X53) and optional resistor (R) in response to the gain control signal(s).

In operation, the switching circuits are arranged to selectively couple one or more of the gain setting networks in the feedback loop of the operational amplifier circuit (X59), in a substantially similar manner as that described for FIG. 5A. The pulse width associated with the gain control signal(s) can again achieve any desired blend between the available gains (G1-G4). Also, each gain setting network can be arranged to have a desired frequency dependant gain as may be desired to achieve a frequency compensated gain adjustment.

In one example, gains G1 and G3 are selected together to achieve a gain error adjustment of −1.0%, gains G1 and G4 are selected together to achieve a gain error adjustment of −0.5%, gains G2 and G3 are selected together to achieve a gain error adjustment of +0.5%, and gains G2 and G4 are selected together to achieve a gain error adjustment of +1.0%.

Figure 5C:
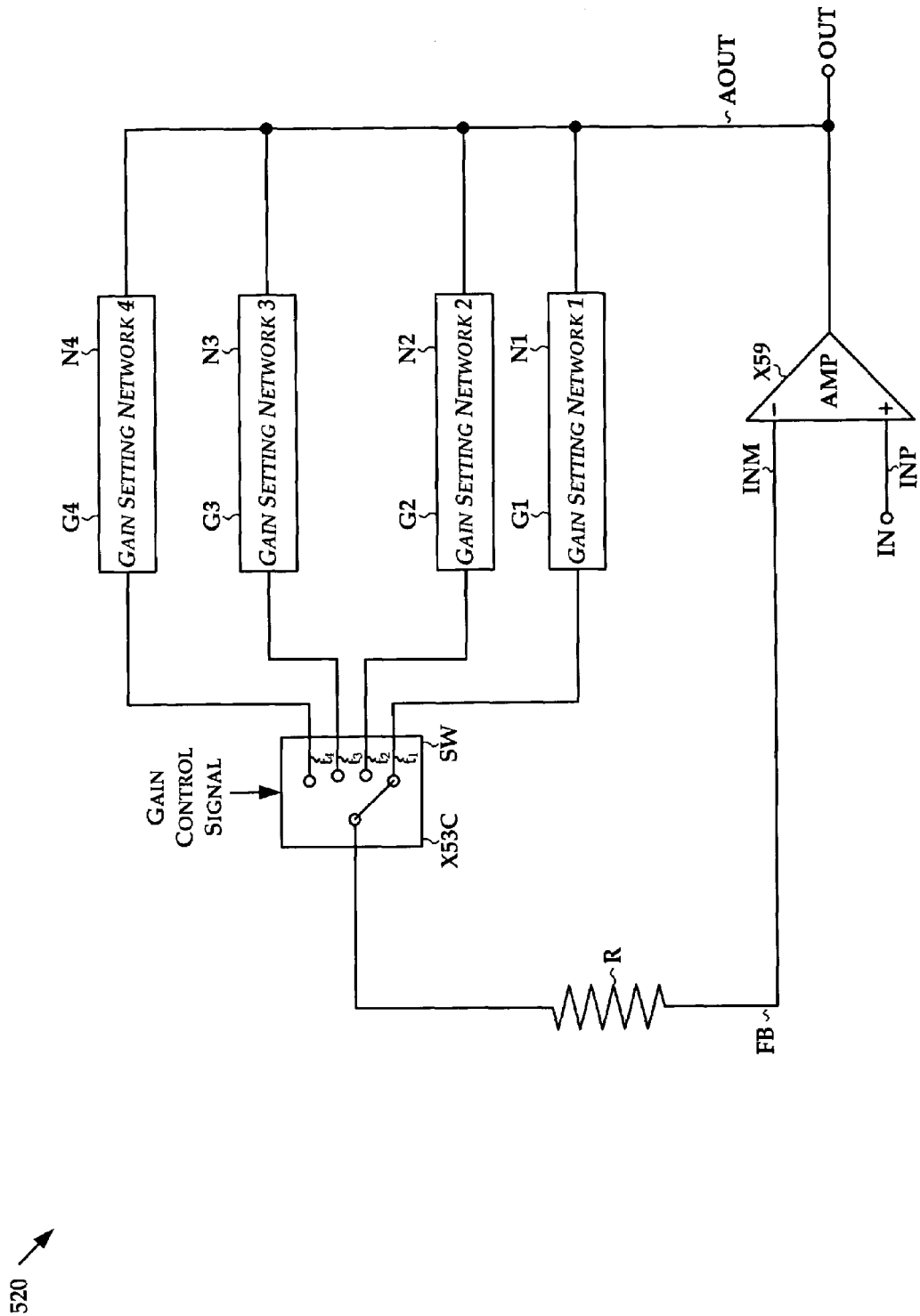

FIG. 5C is a schematic diagram illustrating yet still another example programmable gain amplifier circuit (520) that employs a modulation topology according to at least one aspect of the present disclosure. Programmable gain amplifier circuit 520 includes a four gain setting networks (N1-N4), an operational amplifier circuit (X59), a switching circuit (SW, X53C), and an optional resistor (R).

The first gain setting network (N1) has gain value of G1, while the second third and fourth gain setting networks (N2-N3) have corresponding gain value of G2, G3 and G4, respectively. Each gain setting network is selectively coupled between nodes INM and AOUT via the switching circuit (X53C) and optional resistor (R) in response to the gain control signal. Each gain setting (G1-G4) can optionally have a different frequency dependant gain characteristic.

In operation, the switching circuit (X53C) is arranged to selectively couple one of the gain setting networks (N1-N4) in the feedback loop of the operational amplifier circuit (X59), in a substantially similar manner as that described for FIG. 5A. The pulse width associated with the gain control signal can again achieve any desired blend between the available gains (G1-G4). For example, gain setting network N1 is selected at time t1, gain setting network N2 is selected at time t2, gain setting network N3 is selected at time t3, and gain setting network N4 is selected at time t4.

Desired gain settings can be achieved by varying the amount of time that each gain setting is active/inactive over a period (e.g., T) where the gain setting pattern repeats. In one example, times t1, t2, t3 and t4 are spaced apart in time with equal active times for each selecting gain setting so that the overall gain corresponds to the average of G1, G2, G3 and G4. In other example, only gain settings G1 and G3 are utilized for equal times so that the overall gain is the average of G1 and G3. In still another example, each gain setting is utilized for a different amount of time so that each gain setting is applied for a non-equal percentage of the total period between repeated gain settings. Over-sampled time averaged modulation schemes such as delta-sigma modulation can be used as well.

Figure 6A:
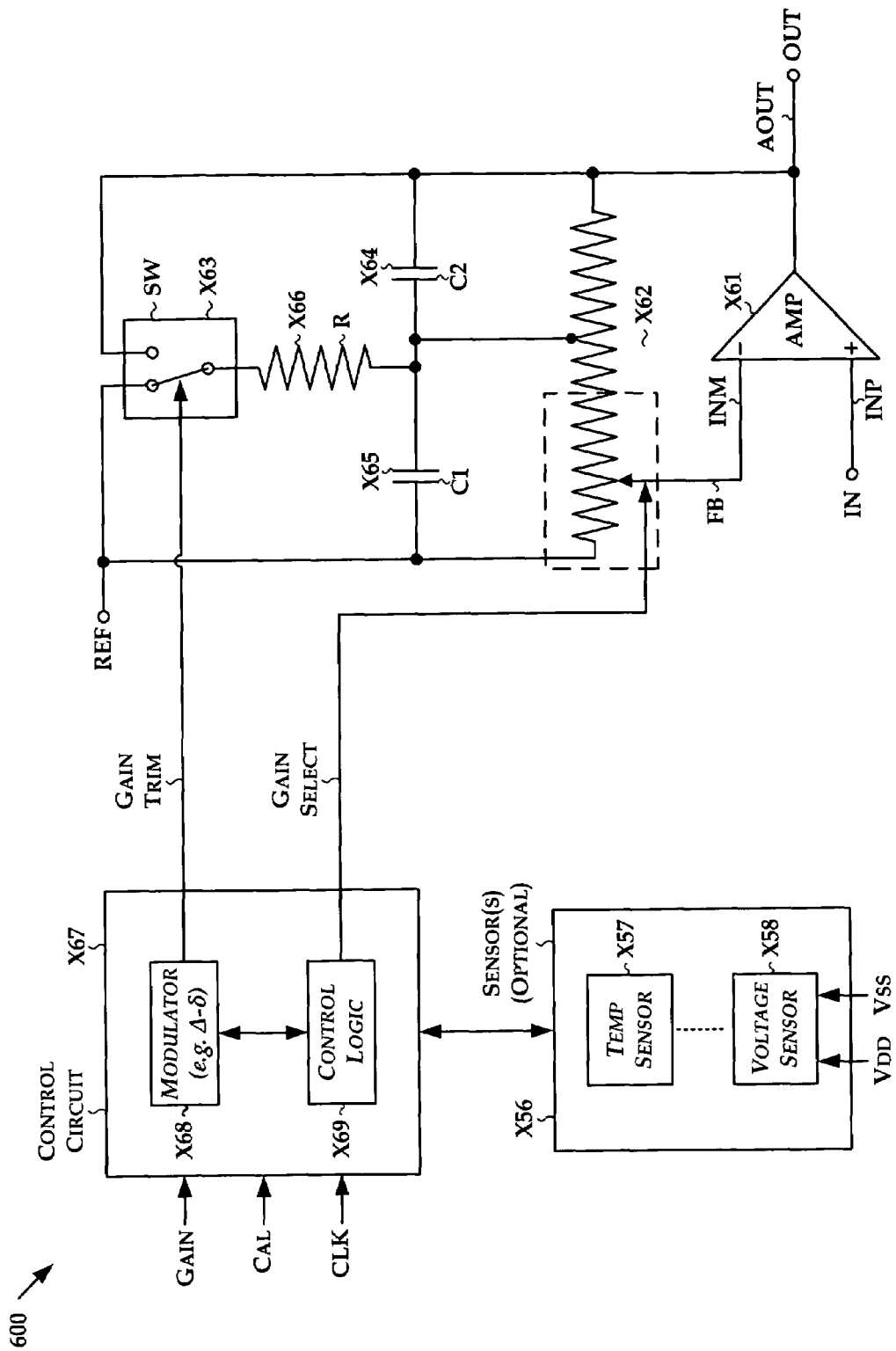
FIGS. 6A-6C are schematic diagrams illustrating example programmable gain amplifier circuits that employ another modulation topology.

FIG. 6A is a schematic diagram illustrating still another example programmable gain amplifier circuit (600) that employs still another modulation topology according to at least one aspect of the present disclosure. Programmable gain amplifier circuit 600 includes an operational amplifier circuit (X61), a digitally controlled potentiometer (X62), a switching circuit (X63), a first capacitor circuit (C1, X64), a second capacitor circuit (C2, X65), an optional resistor circuit (R, X66), and a control circuit (X67). The control circuit (X67) includes functional blocks for a modulator (X68) and a control logic (X69).

The operational amplifier circuit (X61) includes a non-inverting input terminal (INP), an inverting input terminal (INM), and an output terminal (AOUT). The digitally controlled potentiometer (X62) is coupled between the output terminal (AOUT) of the operational amplifier circuit (X61) and a reference potential (REF), and also includes a fixed tap-point and a variable tap-point. The fixed tap-point is coupled to first terminals of the capacitor circuits (X64, X65) and the optional resistor circuit (R). The second terminal of the first capacitor circuit (X64) is coupled to the reference potential (REF), while the second terminal of the second capacitor circuit (X65) is coupled to the output terminal (AOUT) of the operational amplifier circuit (X61). A first terminal of the switching circuit (X63) is coupled to the reference potential (REF). A second terminal of the switching circuit (X63) is coupled to the output (AOUT) of the operational amplifier circuit (X61). The switching circuit (X63) also includes a third terminal that is coupled to the second terminal of the optional resistor circuit (R).

In operation, the switching circuit (X63) is arranged to couple one of the first and second terminals to the third terminal of the switching circuit (X63). When the first terminal is coupled to the third terminal, the overall gain of the programmable gain amplifier circuit (600) corresponds to a first gain setting. When the second terminal is coupled to the third terminal, the overall gain of the programmable gain amplifier circuit (600) corresponds to a second gain setting. The control logic circuit (X67) is arranged to provide a gain select control signal to adjust the feedback provided by the digitally controlled potentiometer circuit (X62). The control logic circuit (X67) is further arranged to provide a gain trim control signal to adjust the pulse width associated with modulating the switching circuit (X63). The operational features provide for a time averaged gain that is smoothed by the capacitors.

Figure 6B:
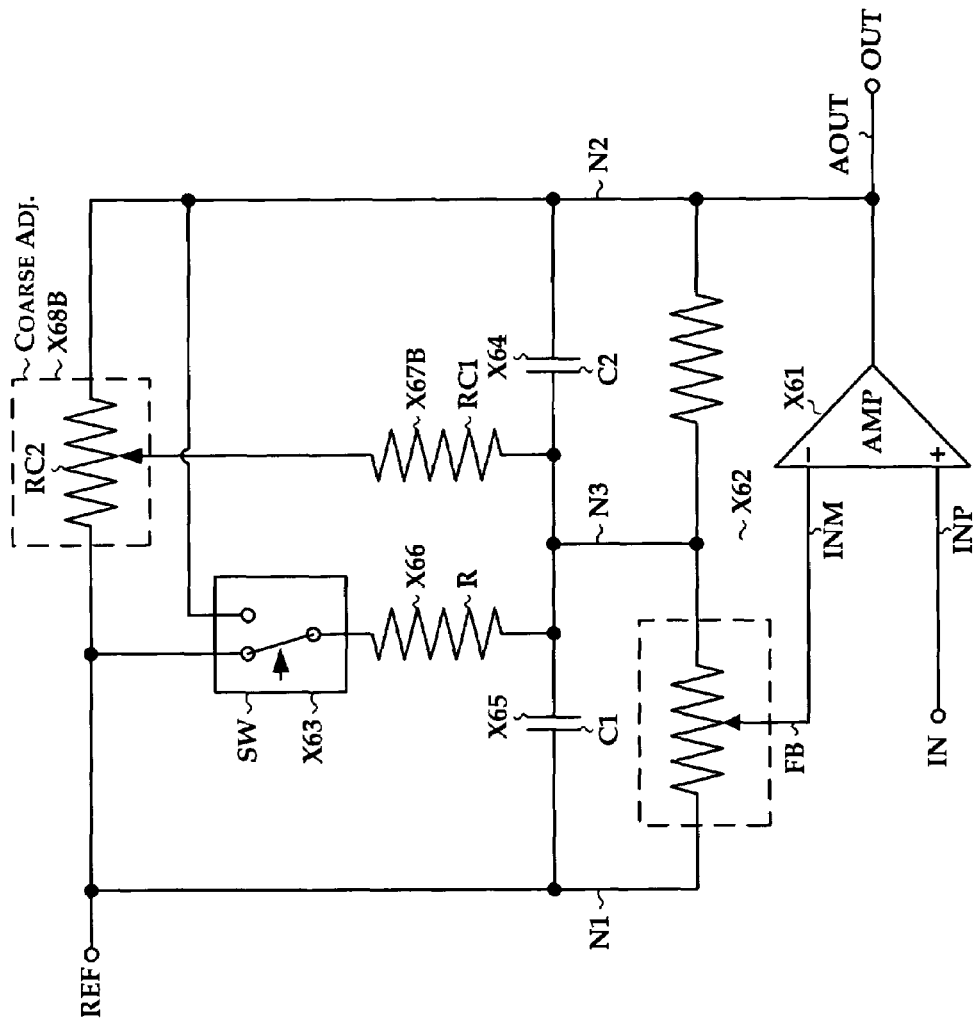

FIG. 6B is a schematic diagram illustrating another example programmable gain amplifier circuit (610) that employs a similar modulation topology to that described for FIG. 6A. Similar to programmable gain amplifier circuit 600 from FIG. 6A, programmable gain amplifier circuit 610 includes an operational amplifier circuit (X61), a digitally controlled potentiometer (X62), a switching circuit (X63), a first capacitor circuit (C1, X64), a second capacitor circuit (C2, X65), and an optional resistor circuit (R, X66).

Programmable gain amplifier circuit 610 further includes an adjustable resistor circuit (X68B, RC2), and an optional resistor (X67B, RC1). Adjustable resistor circuit X68B is coupled between nodes N1 and N2, which corresponds to the reference potential (REF) and the output of the operational amplifier (X61), respectively. A wiper terminal for the adjustable resistor circuit (X68B) is coupled to node N3, which corresponds to the common node between capacitors C1 and C2, via optional resistor RC1 (X67B).

The operation of adjustable switching circuit (X63) is the same as that previously described for FIG. 6A. However, the adjustable resistor circuit (X68B) is arranged to operate as a coarse gain adjustment circuit that changes the overall gain of the digitally controlled potentiometer (X62) similar to that previously described, for example, by FIGS. 1A and 1B. The operational features again provide for a time averaged gain that is smoothed by the capacitors (C1 and C2).

Figure 6C:
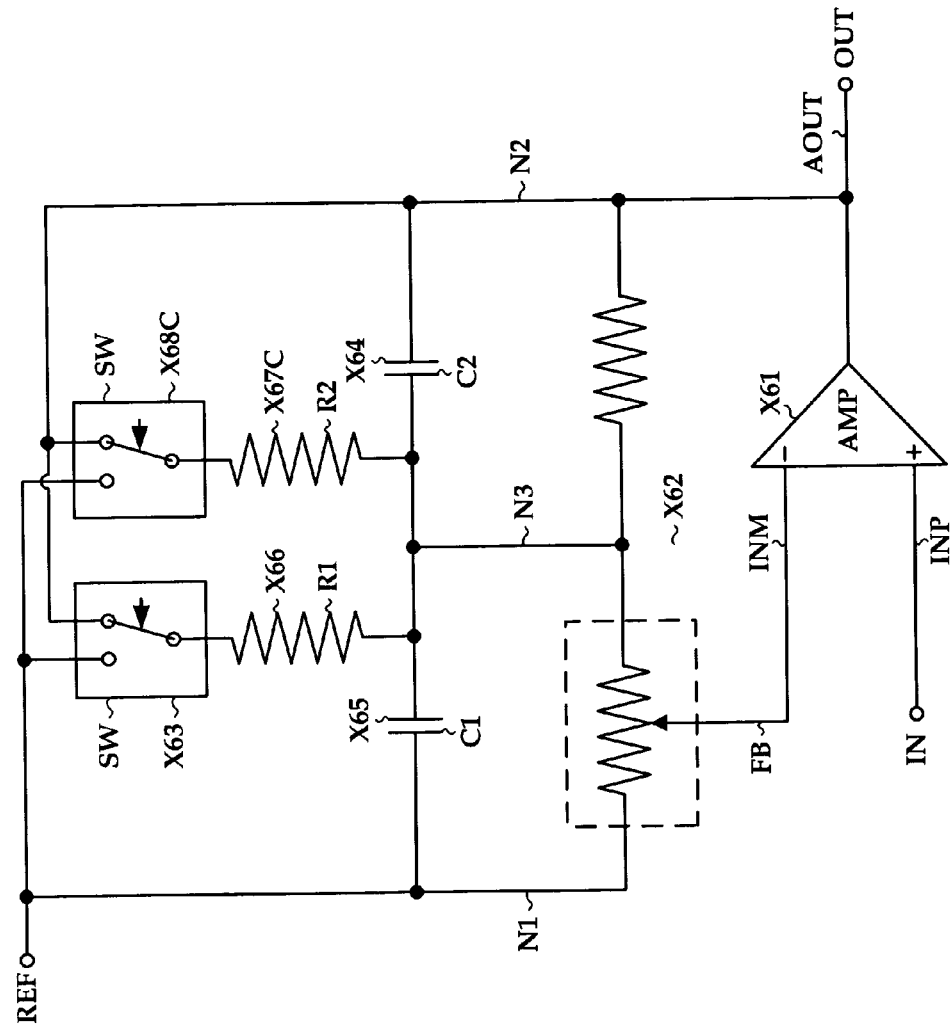

FIG. 6C is a schematic diagram illustrating another example programmable gain amplifier circuit (620) that employs a similar modulation topology to that described for FIGS. 6A and 6B. Similar to programmable gain amplifier circuit 600, programmable gain amplifier circuit 620 includes an operational amplifier circuit (X61), a digitally controlled potentiometer (X62), a switching circuit (X63), a first capacitor circuit (C1, X64), a second capacitor circuit (C2, X65), an optional resistor circuit (R1, X66), and a control circuit (X67).

Programmable gain amplifier circuit 610 further includes a second switching circuit (X68C), and a resistor (X67C, R2). Switching circuit X68 includes contact terminals that are coupled to nodes N1, N2 and node N3 via resistor R2. Node N1 corresponds to the reference potential (REF), while node N2 corresponds to the output of the operational amplifier (X61). Node N3 corresponds to the common node between capacitors C1 and C2.

The operation of adjustable switching circuit (X63) is the same as that previously described for FIGS. 6A and 6B. However, switching circuit (X68C) is arranged to operate with resistor R2 as a coarse gain adjustment circuit that changes the overall gain of the digitally controlled potentiometer (X62) similar to that previously described, for example, by FIGS. 1A and 1B. The operational features again provide for a time averaged gain that is smoothed by the capacitors (C1 and C2). Resistors R1 and R2 can be of different values so that the amount of adjustment provided by switching operations are different for the two switching circuits (X63 and X68C)

As will be appreciated by those of skill in the art having read the present disclosure, the modulation of the switching circuits (X53, X53C, X63, and X68C) from FIGS. 5A, 5B, 5C, 6A, 6B and 6C can be provided in a manner that is similar to delta-sigma modulation techniques or other time averaged modulation schemes to provide a wide range of gain trimming features for the programmable gain amplifier circuit (600).

The programmable gain amplifier circuits (600, 610 and 620) of FIGS. 6A, 6B and 6C may also include the optional sensor circuit (X56) from FIG. 5A, where the sensor circuit can again include any variety of sensors such as, but not limited to, a temperature sensor (X57), a voltage sensor (X58), etc. For such as example implementation, the control logic circuit can be arranged to evaluate various operating conditions associated with the circuit (e.g., monitoring voltages, currents, operating temperatures, etc.) and effecting various changes to the modulation based on the dynamically measured operating conditions. In this way, the gain of the programmable gain amplifier circuits (600, 610 and 620) can be carefully controlled. In some instances, it may be desirable to change the modulation technique when one of the monitored operating conditions changes beyond a predetermined threshold.

Gain Selection/Trimming Flow

Figure 7:
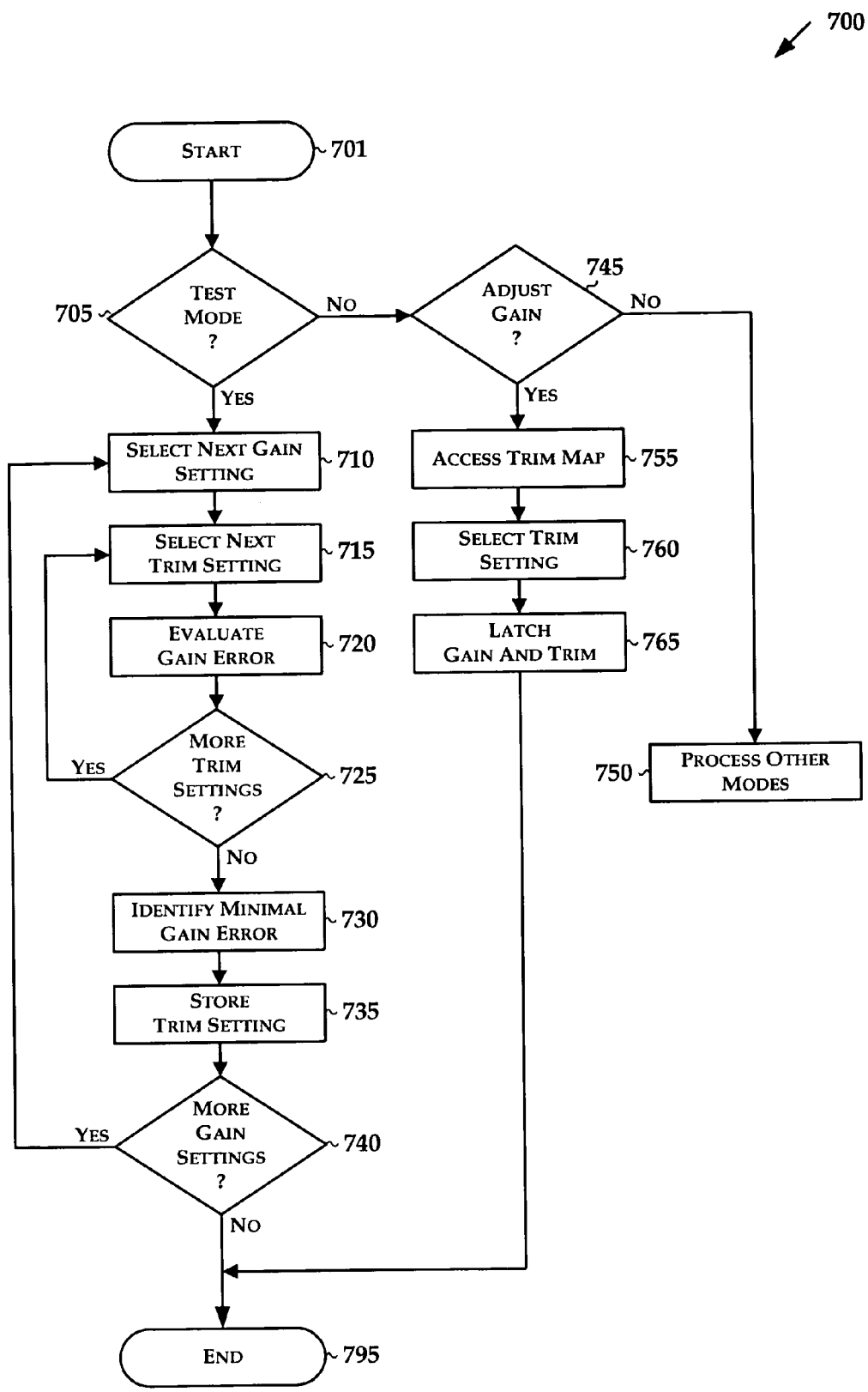
FIG. 7 is a flow chart illustrating a method for identifying and/or setting gain adjustments in a programmable gain amplifier circuit; all arranged according to aspects of the present disclosure.
Figure 8:
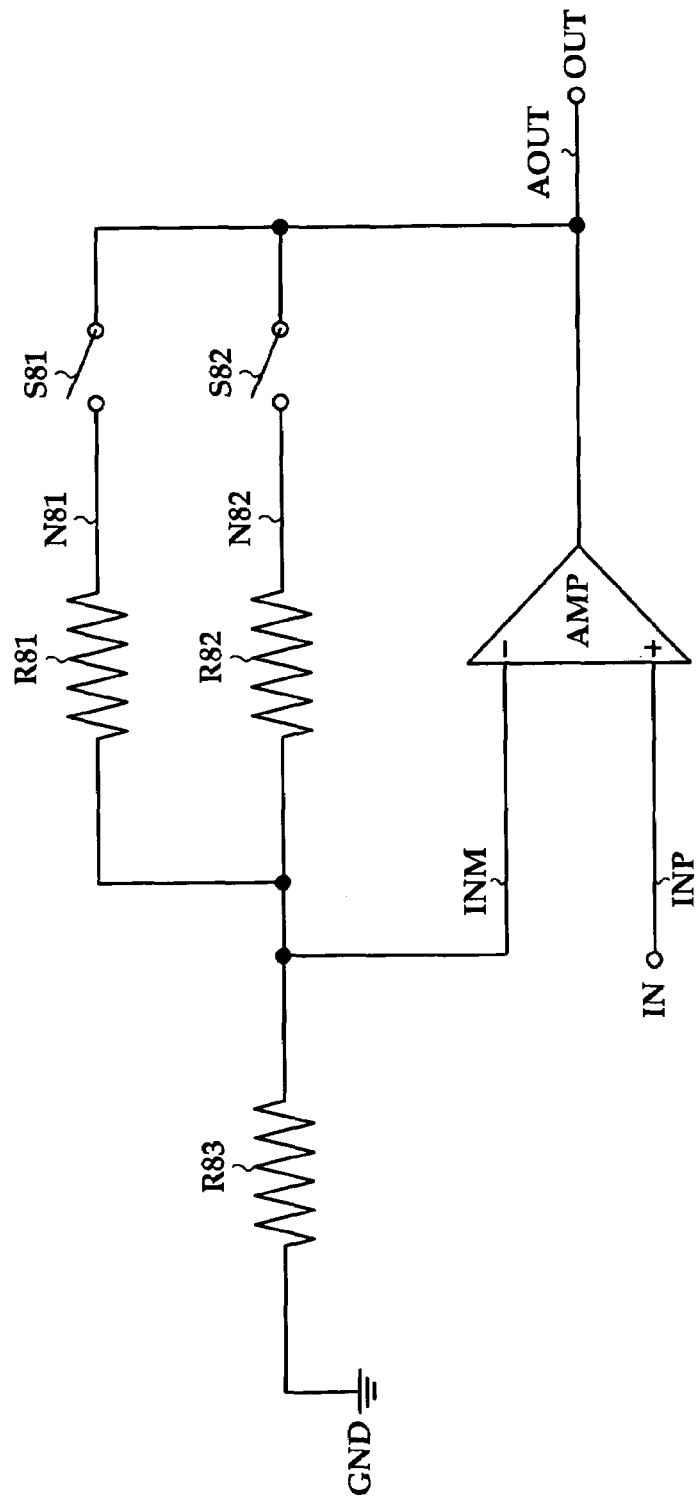
FIG. 8 is a schematic of a conventional programmable gain amplifier circuit.

FIG. 7 is a flow chart (700) for identifying and/or setting gain adjustments in a programmable gain amplifier circuit that is arranged according to at least one aspect of the present disclosure. The programmable gain amplifier circuit corresponds to a circuit such as those described in FIGS. 1-6 above, as well as others that are similarly arranged.

The described system/circuit is arranged to evaluate the current operating mode at decision block 705. When the current operating mode corresponds to a test mode, the process flows from block 705 to block 710 where the system cycles to the next available gain settings (e.g., gain setting 1, gain setting 2, etc.) to test the accuracy of each gain setting. After the next gain setting is selected, the system process flows to block 715 where the next available trim setting (e.g., gain trim setting 1, gain trim setting 2, etc.) is selected. Processing continues to block 720 where the gain error associated with the current gain/trim settings is evaluated. At decision block 725 the system determines if more trim settings are to be evaluated. When additional trim settings are to be evaluated, processing continues back to block 715. Otherwise processing flows to block 730 where the trim setting with a minimal gain error is identified for the gain setting. At block 735 the identified trim setting is stored or logged. At decision block 740 the system determines if additional gain settings are to be tested. When additional gain settings are to be tested, processing continues to block 710. Otherwise processing of the test mode is concluded at block 795.

The identified "best" available trim settings can be stored as values in a trim map or look-up table (LUT) such as those previously described. The trim map can be implemented on the same die as the programmable gain amplifier circuit (e.g., a fuse link table, a non-volatile memory array, or some other mapping mechanism), on a separate die in a multi-chip module, or in a separate micro-electronic circuit that is arranged to communicate the look-up table information to the programmable gain amplifier circuit.

When the test mode is inactive, processing flows from decision block 705 to decision block 745 where the selected mode is evaluated to determine if a gain adjustment (or normal operating) mode is active. When the gain adjustment mode is active, processing continues from decision block 745 to block 745 where the trim map is accessed. Continuing to block 760 a trim setting is selected based on the trim map. Proceeding to block 765 the gain and trim settings are used to generate the appropriate control signals and/or latched into a latch means such as a register. Processing concludes at block 795.

When the test mode is inactive and the adjust gain mode is inactive, processing flows from decision block 745 to block 750 where additional modes can be processed. In one example, the circuits are operated in a "program gain/trim mode", where the trim map is loaded from a separate set of values that can be provided by an externally provided table (e.g., ROM, EPROM, EEPROM, LUT, NVM, etc.). In another example, the circuits are operated in a "run mode", where the gain and trim settings cannot be changed. In still another example the circuits are operated in a "program gain mode", where the trim map and gain settings are selected to adjust the trim setting and amplifier gain similar to that described for FIG. 7. Other modes are also contemplated and considered within the scope of the present disclosure. For implementations where only test mode and adjust gain/normal operating mode are available, decision block 745 and processing block 750 can be eliminated.

Although the invention has been described herein by way of various example embodiments, variations in the structures, features, and methodological steps described herein may be made without departing from the spirit and scope of the invention. For example, the positioning of the various components may be varied. Individual components and arrangements of components may be substituted as known to the art. Since many embodiments of the invention can be made without departing from the spirit and scope of the invention, the invention resides in the claims hereinafter appended.

What is claimed is:

1. A programmable gain amplifier circuit for receiving an input signal and providing an output signal with an adjustable gain corresponding to a user initiated gain setting, the programmable gain amplifier circuit comprising:

an operation amplifier circuit including a non-inverting input terminal configured to receive the input signal, an inverting input terminal configured to receive a feedback signal, and an output terminal configured to provide the output signal;

a digitally controlled potentiometer that is coupled between the output terminal and a reference terminal, wherein the digitally controlled potentiometer includes a wiper terminal that is coupled to the inverting input terminal, wherein the digitally controlled potentiometer has a first resistance value between the output terminal and an intermediate node, a second resistance value between the intermediate node and the wiper terminal, and a third resistance value between the wiper terminal and the reference terminal, wherein the second and third resistance values vary in response to a gain select control signal by adjusting a wiper setting for the digitally controlled potentiometer;

a first capacitor circuit that is coupled between the reference terminal and the intermediate node;

a second capacitor circuit that is coupled between the output terminal and the intermediate node;

a resistor circuit;

a switching circuit that includes a first switching terminal coupled to the intermediate node through the resistor circuit, a second switching terminal coupled to the reference terminal, and a third switching terminal coupled to the output terminal, wherein the switching circuit is arranged to couple the first switching terminal to the reference terminal in a first position, wherein the switching circuit is arranged to coupled to the first switching terminal to the output terminal in a second position, and wherein the switching circuit selects one of the first position and the second position in response to a gain trim control signal; and a control circuit that is arranged to provide the gain control signal and the gain trim control signal in response to the user initiated gain setting, wherein the gain trim control signal is modulated such that the switching circuit oscillates between the first position and the second position according to a duty cycle assigned to the user initiated gain setting, wherein the duty cycle corresponds to the time averaged modulation between the first position and the second position.

2. The programmable gain amplifier circuit of claim 1, the digitally controlled potentiometer comprising a series coupled tapped resistor array that is coupled between the output terminal and the reference terminal, wherein the series coupled tapped resistor array has an array of resistance values series coupled between an array of tap points, wherein one of the array of tap points is the intermediate node, and wherein another of the tap points is associated with the wiper terminal.

3. The programmable gain amplifier circuit of claim 2, wherein the series coupled tapped resistor array is arranged as one of: a matched resistor array, a binary weighted array, a linearly scaled array, a logarithmically scaled array, and an arbitrarily weighted array.

4. The programmable gain amplifier circuit of claim 2, the digitally controlled potentiometer further comprising a multiplexer circuit that has a plurality of multiplexer input terminals, each being coupled to a corresponding one of the array of tap points, and a multiplexer output terminal that is coupled to the inverting input terminal, wherein the multiplexer circuit is arranged to coupled one of the plurality of multiplexer input terminals to the multiplexer output terminal.

5. The programmable gain amplifier circuit of claim 1, the digitally controlled potentiometer comprising a parallel array of resistors, wherein each resistor in the parallel array of resistors includes a first resistor terminal that is coupled to the inverting input terminal, and a second resistor terminal that is selectively coupled to one of the reference terminal and the output terminal.

6. The programmable gain amplifier circuit of claim 5, wherein the resistors in the parallel array are arranged as one of: a matched resistor array, a binary weighted array, a linearly scaled array, a logarithmically scaled array, and an arbitrarily weighted array.

7. The programmable gain amplifier circuit of claim 5, the digitally controlled potentiometer further comprising a plurality of switch circuits, wherein each switch circuit includes a first switch terminal that is coupled to the reference terminal, a second switch terminal that is coupled to the output terminal, and a third switch terminal that is coupled to the second resistor terminal of a corresponding one of the resistors in the parallel array of resistors, wherein the third switch terminal of each switch circuit is selectively coupled to one of the first switch terminal and the second switch terminal.

8. The programmable gain amplifier circuit of claim 1, wherein the digitally controlled potentiometer is an R-2R resistor ladder arrangement that is arranged to selectively couple one of the reference terminal and the output terminal to a respective input of the R-2R ladder circuit.

9. The programmable gain amplifier circuit of claim 1, wherein control circuit further comprises a look-up table, wherein the duty cycle is retrieved from the look-up table in response to the user initiated gain setting.

10. The programmable gain amplifier circuit of claim 9, wherein gain setting control circuit is also retrieved from the look-up table in response to the user initiated gain setting.

11. The programmable gain amplifier circuit of claim 1, wherein the control circuit comprising a modulator and a control logic, wherein the modulator is arranged to provide the gain trim control signal and the control logic is arranged to provide the gain select control signal.

12. The programmable gain amplifier circuit of claim 11, the control circuit further comprising a sensor circuit, wherein the modulator is arranged to vary the duty cycle of the gain trim control signal in response to changes in operating conditions sensed by the sensor circuit, wherein the operating conditions correspond to one of voltages, currents, and operating temperatures of the programmable gain amplifier circuit.

13. The programmable gain amplifier circuit of claim 1, further comprising a sensor circuit that is arranged in cooperation with the control circuit to vary the duty cycle of the gain trim control signal in response to changes in operating conditions sensed by the sensor circuit, wherein the operating conditions correspond to one of voltages, currents, and operating temperatures associated with the programmable gain amplifier circuit.

14. The programmable gain amplifier of claim 1, wherein the control circuit is further arranged such that the modulation corresponds to one of a fixed duty cycle modulation, a varied duty cycle modulation or a delta-sigma modulation.

15. The programmable gain amplifier circuit of claim 1, further comprising:
a second switching circuit that includes a fourth switching terminal coupled to the intermediate node, a fifth switching terminal coupled to the reference terminal, and a sixth switching terminal coupled to the output terminal, wherein the second switching circuit is arranged to couple the fourth switching terminal to the reference terminal in a third position, wherein the second switching circuit is also arranged to couple the fourth switching terminal to the output terminal in a fourth position, and wherein the second switching circuit selects one of the first position and the second position in response to a coarse gain trim control signal;
a first resistor that is coupled between the first switching terminal and the intermediate terminal;
a second resistor that is coupled between the fourth switching terminal and the intermediate terminal, wherein the first resistor and the second resistor have different values from one another; and
wherein the control circuit is further arranged to provide the coarse gain trim control signal in response to the user initiated gain setting, wherein the coarse gain trim control signal is modulated such that the second switching circuit oscillates between the third position and the fourth position as a function of a second duty cycle that is assigned to the user initiated gain setting.

16. The programmable gain amplifier circuit of claim 1, further comprising a second digitally controlled potentiometer that is coupled between the output terminal and a reference terminal, wherein the second digitally controlled potentiometer includes a second wiper terminal that is coupled to the intermediate node, wherein the second digitally controlled potentiometer has a fourth resistance value between the output terminal and the second wiper terminal, and a fifth resistance value between the second wiper terminal and the reference terminal, wherein the fourth and fifth resistance values vary in response to a coarse gain select control signal by adjusting a second wiper setting for the second digitally controlled potentiometer, wherein the control circuit is further arranged to provide the coarse gain control signal in response to the user initiated gain setting.

17. A programmable gain amplifier circuit for receiving an input signal and providing an output signal with an adjustable gain corresponding to a user initiated gain setting, the programmable gain amplifier circuit comprising:
an operation amplifier circuit including a non-inverting input terminal configured to receive the input signal, an inverting input terminal configured to receive a feedback signal, and an output terminal configured to provide the output signal;
a digitally controlled potentiometer means that is coupled between the output terminal and a reference terminal, wherein the digitally controlled potentiometer means includes a wiper terminal that is coupled to the inverting input terminal, wherein the digitally controlled potentiometer has a first resistance value between the output terminal and an intermediate node, a second resistance value between the intermediate node and the wiper terminal, and a third resistance value between the wiper terminal and the reference terminal, wherein the second and third resistance values vary in response to a gain select control signal by adjusting a wiper setting for the digitally controlled potentiometer means;

a first capacitor means that is coupled between the reference terminal and the intermediate node;

a second capacitor means that is coupled between the output terminal and the intermediate node;

a first resistor means;

a switching means that includes a first switching terminal coupled to the intermediate node through the first resistor means, a second switching terminal coupled to the reference terminal, and a third switching terminal coupled to the output terminal, wherein the switching means is arranged to couple the first switching terminal to the reference terminal in a first position, wherein the switching means is also arranged to coupled to the first switching terminal to the output terminal in a second position, and wherein the switching means selects one of the first position and the second position in response to a gain trim control signal; and a control means that is arranged to provide the gain control signal and the gain trim control signal in response to the user initiated gain setting, wherein the gain trim control signal is modulated such that the switching means oscillates between the first position and the second position according to a duty cycle assigned to the user initiated gain setting, wherein the duty cycle corresponds to the time averaged modulation between the first position and the second position.

18. The programmable gain amplifier circuit of claim 17, further comprising:

a second resistor means, wherein the first resistor means and the second resistor means have different values from one another; and a second switching means that includes a fourth switching terminal coupled to the intermediate node through the second resistor means, a fifth switching terminal coupled to the reference terminal, and a sixth switching terminal coupled to the output terminal, wherein the second switching means is arranged to couple the fourth switching terminal to the reference terminal in a third position, wherein the second switching means is also arranged to couple the fourth switching terminal to the output terminal in a fourth position, and wherein the second switching means selects one of the first position and the second position in response to a coarse gain trim control signal;

wherein the control means is further arranged to provide the coarse gain trim control signal in response to the user initiated gain setting, wherein the coarse gain trim control signal is modulated such that the second switching means oscillates between the third position and the fourth position according to a second duty cycle assigned to the user initiated gain setting, wherein the second duty cycle corresponds to the time averaged modulation between the third position and the fourth position.

19. The programmable gain amplifier circuit of claim 1, further comprising a second digitally controlled potentiometer means that is coupled between the output terminal and a reference terminal, wherein the second digitally controlled potentiometer means includes a second wiper terminal that is coupled to the intermediate node, wherein the second digitally controlled potentiometer means has a fourth resistance value between the output terminal and the second wiper terminal, and a fifth resistance value between the second wiper terminal and the reference terminal, wherein the fourth and fifth resistance values vary in response to a coarse gain select control signal by adjusting a second wiper setting for the second digitally controlled potentiometer means, wherein the control circuit is further arranged to provide the coarse gain control signal in response to the user initiated gain setting.

20. A method for trimming gain adjustments in a programmable gain amplifier circuit that receives an input signal and provides an output signal in response thereto, wherein the programmable gain amplifier has an adjustable gain corresponding to a user initiated gain setting, the method comprising:

retrieving a duty cycle setting for a switching circuit from a look-up-table in response to the user initiated gain setting;

adjusting a gain setting control signal for a digitally controlled potentiometer in response to the user initiated gain setting, wherein the digitally controlled potentiometer is coupled between an output terminal of an operational amplifier circuit and a reference terminal, wherein the digitally controlled potentiometer includes a wiper terminal that is coupled to an inverting input terminal of the operational amplifier circuit, wherein the digitally controlled potentiometer has a first resistance value between the output terminal and an intermediate node, a second resistance value between the intermediate node and the wiper terminal, and a third resistance value between the wiper terminal and the reference terminal, wherein the second and third resistance values vary in response to a gain select control signal by adjusting a wiper setting for the digitally controlled potentiometer;

coupling a first capacitor between the intermediate node and the inverting input terminal;

coupling a second capacitor between the intermediate node and the output terminal;

selectively coupling the output terminal to the intermediate node through a resistor when a switching means is in a first position in response to a gain trim control signal;

selectively coupling the reference terminal to the intermediate node through the resistor when the switching means is in a second position in response to the gain trim control signal; and dynamically adjusting the gain trim control signal such that the switching means modulates between the first position and the second position according to the retrieved duty cycle for the user initiated gain setting, wherein the duty cycle corresponds to the time averaged modulation between the first position and the second position.

* * * * *